United States Patent  
Sakai et al.

(10) Patent No.: US 10,433,381 B2  
(45) Date of Patent: Oct. 1, 2019

(54) LED DRIVE CIRCUIT

(71) Applicants: CITIZEN WATCH CO.,LTD., Nishitokyo-shi, Tokyo (JP); CITIZEN ELECTRONICS CO., LTD., Fujiyoshida-shi, Yamanashi (JP)

(72) Inventors: Keisuke Sakai, Yamanashi (JP); Takashi Akiyama, Sayama (JP)

(73) Assignees: CITIZEN WATCH CO., LTD., Nishitokyo-Shi, Tokyo (JP); CITIZEN ELECTRONICS CO., LTD., Fujiyoshida-Shi, Yamanashi (JP)

( * ) Notice: Subject to any disclaimer, the term of this patent is extended or adjusted under 35 U.S.C. 154(b) by 0 days.

(21) Appl. No.: 15/764,207

(22) PCT Filed: Sep. 27, 2016

(86) PCT No.: PCT/JP2016/078526  
§ 371 (c)(1),  
(2) Date: Mar. 28, 2018

(87) PCT Pub. No.: WO2017/057401  
PCT Pub. Date: Apr. 6, 2017

(65) Prior Publication Data  
US 2018/0288843 A1 Oct. 4, 2018

(30) Foreign Application Priority Data  
Sep. 28, 2015 (JP) ................... 2015-189615  
Nov. 30, 2015 (JP) ................... 2015-232597

(51) Int. Cl.  
*H05B 33/08* (2006.01)  
*H01L 25/16* (2006.01)

(52) U.S. Cl.  
CPC ..... *H05B 33/0821* (2013.01); *H05B 33/0809* (2013.01); *H01L 25/167* (2013.01); *Y02B 20/348* (2013.01)

(58) Field of Classification Search  
CPC combination set(s) only.  
See application file for complete search history.

(56) References Cited

U.S. PATENT DOCUMENTS 8,525,427 B2 * 9/2013 Samoilenko ....... H05B 33/0809  
                                                                      315/185 R  
2010/0308739 A1 * 12/2010 Shteynberg ......... H05B 33/083  
                                                                      315/193

(Continued)

FOREIGN PATENT DOCUMENTS

| JP | H01-264276 | 10/1989 |
| JP | H08-148721 | 6/1996 |
| JP | 2015-513177 A | 4/2015 |

OTHER PUBLICATIONS

International Search Report and Written Opinion for PCT App No. PCT/JP2016/078526 dated Dec. 27, 2016, 10 pgs.

*Primary Examiner* — Douglas W Owens  
*Assistant Examiner* — Jianzi Chen  
(74) *Attorney, Agent, or Firm* — Procopio, Cory, Hargreaves & Savitch LLP

(57) ABSTRACT

An LED drive circuit in which a bright change of an LED is suppressed even if the voltage of a full-wave rectified waveform fluctuates is provided. The LED drive circuit includes a bridge rectifier circuit, an LED string made up by a plurality of LEDs being connected in series and supplied with a current from the bridge rectifier circuit, and a current limiting circuit that has a current input terminal and a current output terminal connected onto a path that starts from the bridge rectifier circuit and returns to the bridge rectifier circuit via the LED string, which limits a current that flows (Continued)

through the LED string to an upper limit current value or smaller, and further, which decreases the upper limit current value in accordance with the amount of rise in the voltage when the voltage at the current input terminal viewed from the current output terminal rises.

14 Claims, 19 Drawing Sheets

(56) References Cited

U.S. PATENT DOCUMENTS

2014/0361695 A1\* 12/2014 Akiyama ........... H05B 33/0812
  315/185 R
2015/0305102 A1   10/2015 Yu \* cited by examiner

US 10,433,381 B2

LED DRIVE CIRCUIT

CROSS-REFERENCE TO RELATED APPLICATIONS

This application is a U.S. National Stage entry of PCT Application No: PCT/JP2016/078526 filed Sep. 27, 2016, which claims priority to Japanese Patent Application No. 2015-189615, filed Sep. 28, 2015, and Japanese Patent Application No. 2015-232597, filed Nov. 30, 2015 the contents of which are incorporated herein by reference.

FIELD

The present invention relates to an LED drive circuit that includes an LED (Light Emitting Diode) string and a current limiting circuit connected in series to the LED string and which applies a full-wave rectified waveform to the LED string.

BACKGROUND

An LED drive circuit is known, which applies a voltage obtained by full-wave rectifying a commercial alternating-current power source (hereinafter, referred to as a full-wave rectified waveform) to an LED string and turns on the LED string. In many cases, a current limiting circuit in the LED drive circuit is connected in series with the LED string in order to stabilize the operation (for example, see FIG. 3 of Patent Literature 1).

FIG. 28 is a circuit diagram of a conventional LED drive circuit 10 (LED lamp) illustrated in FIG. 3 of Patent Literature 1. In FIG. 28, symbols are changed from those of Patent Literature 1. In the following explanation, the term of Patent Literature 1 is described within brackets.

The LED drive circuit 100 (LED lamp) illustrated in FIG. 28 includes a bridge rectifier circuit 106 (rectifier circuit), a zener diode 115 (constant voltage diode), a constant current diode 116, and a plurality of LEDs (Light Emitting Diodes) 101a to 101n. A commercial alternating-current power source, not illustrated schematically, is connected to input terminals 111 and 113 of the bridge rectifier circuit 106. The zener diode 115, the constant current diode 116, and the plurality of LEDs 101a to 101n are connected in series. The cathode of the zener diode 115 is connected to a terminal that outputs a current of the bridge rectifier circuit 106 and the cathode of the LED 101n is connected to a terminal to which the current of the bridge rectifier circuit 106 returns.

The bridge rectifier circuit 106 outputs a full-wave rectified waveform from the terminal that outputs a current when the terminal to which the current returns is grounded. The zener diode 115 is used as a voltage drop element. The constant current diode 116 corresponds to the current limiting circuit that is connected in series to the LED string described previously. The plurality of LEDs 101a to 101n is connected in series and forms an LED string.

In the LED drive circuit 110 illustrated in FIG. 28, when the full-wave rectified waveform is in a low voltage phase, no current flows through the LED string, and therefore the LEDs 101a to 101n do not turn on. When the voltage of the full-wave rectified waveform rises and the voltage between both ends of the LED string exceeds a threshold voltage of the LED string, a current flows through the LED string, and therefore the LEDs 101a to 101n turn on. At this time, the upper limit value of the current that flows through the LED string is limited by the constant current diode 116, and therefore the current is constant during almost all the period in which the LEDs 101a to 101n are on. The threshold voltage of the LED string is a sum of the forward voltage drop of each of the LEDs 101a to 101n connected in series within the LED string.

CITATION LIST

Patent Literature

Patent Literature 1 Japanese Laid Open Patent Document No. H1-264276 (FIG. 3)

SUMMARY

In the LED drive circuit 110 that includes an LED string and a current limiting circuit connected in series to the LED string and which drives the LED string by a full-wave rectified waveform, when the voltage (amplitude) of the full-wave rectified waveform fluctuates, brightness of the LED also changes. In other words, even though the current that flows through the LED string during the period in which the LED is on is constant, the period fluctuates, and therefore brightness also changes in accordance with fluctuations in the voltage of the full-wave rectified waveform.

An object of the present invention is to provide an LED drive circuit in which a bright change of an LED is suppressed even if the voltage of a full-wave rectified waveform fluctuates.

An LED drive circuit is provided, which is characterized by including a bridge rectifier circuit, an LED string in which a plurality of LEDs is connected in series, and a current limiting circuit having a current input terminal and a current output terminal and in which a current that is output from the bridge rectifier circuit returns to the bridge rectifier circuit via the LED string and the current limiting circuit, and the current limiting circuit decreases an upper limit current value in accordance with an amount of rise in the voltage when the voltage at the current input terminal viewed from the current output terminal rises.

In the bridge rectifier circuit connected to a commercial alternating-current power source, when the voltage (effective value) of the commercial alternating-current power source rises, the amplitude of a full-wave rectified waveform, which is an output thereof, is large. On the other hand, the LED string has a threshold voltage and only during the period in which the voltage of the full-wave rectified waveform exceeds the threshold voltage, a current flows and the LED string turns on. In other words, when the amplitude of the full-wave rectified waveform is large, the period in which the LED string is on is long. Thus, bright fluctuations in the current limiting circuit may be suppressed by decreasing the current that flows through the LED string by an amount corresponding to the increase in the period according to the increase in the amplitude of the full-wave rectified waveform.

An LED drive circuit is provided, which is characterized by including a bridge rectifier circuit, an LED string formed by a plurality of LEDs being connected in series and supplied with a current from the bridge rectifier circuit, and a current limiting circuit that has a current input terminal and a current output terminal connected onto a path that starts from the bridge rectifier circuit and returns to the bridge rectifier circuit via the LED string, which limits a current that flows through the LED string to an upper limit current value or smaller, and further, which decreases the upper limit current value in accordance with an amount of rise in the voltage when the voltage at the current input terminal viewed from the current output terminal rises.

The current limiting circuit of the above-described LED drive circuit may include a switch element, a current detection resistor, a current detection element, a first resistor, and a second resistor, and one end of the switch element may be connected to the current input terminal, the other end thereof may be connected to one end of the current detection resistor, and the switch element may further have a control terminal, the other end of the current detection resistor may be connected to the current output terminal, the current detection element may have an inverting input terminal connected to one end of the first resistor and one end of the second resistor and an output terminal connected to the control terminal, the other end of the first resistor may be connected to a path from a terminal that outputs a current of the bridge rectifier circuit up to the current input terminal via the LED string, and the other end of the second resistor may be connected to the one end of the current detection resistor.

In the above-described LED drive circuit, the current detection element may include a transistor, an operational amplifier, or a shunt regulator.

In the above-described LED drive circuit, the current detection element may include a transistor and a first zener diode.

The current limiting circuit of the above-described LED drive circuit may further include a second zener diode between the one end of the current detection resistor and the one end of the first resistor.

The current limiting circuit of the above-described LED drive circuit may further include a third resistor inserted between the second zener diode and the one end of the first resistor and a fourth resistor inserted between the one end of the first resistor and the one end of the second resistor.

The above-described LED drive circuit may further include a capacitor and a resistor connected in parallel to the LED string.

The current limiting circuit of the above-described LED drive circuit may include a switch element, a current detection resistor, an inverting amplifier circuit including a first operational amplifier, a second operational amplifier, a fifth resistor, and a sixth resistor, and one end of the switch element may be connected to the current input terminal, the other end thereof may be connected to one end of the current detection resistor, and the switch element may further have a control terminal, the other end of the current detection resistor may be connected to the current output terminal, an input terminal of the inverting amplifier circuit may be connected to one end of the fifth resistor or one end of the sixth resistor and an output terminal thereof may be connected to a non-inverting input terminal of the second operational amplifier, an inverting input terminal of the second operational amplifier may be connected to one end of the current detection resistor and an output terminal thereof may be connected to the control terminal, the other end of the fifth resistor may be connected to a path from a terminal that outputs a current of the bridge rectifier circuit up to the current input terminal via the LED string, the other end of the sixth resistor may be connected to the one end of the current detection resistor, and the fifth resistor and the sixth resistor may be connected in series.

The current limiting circuit of the above-described LED drive circuit may further include a third zener diode whose anode is connected to the other end of the sixth resistor and whose cathode is connected to one end of the fifth resistor or one end of the sixth resistor.

The current limiting circuit of the above-described LED drive circuit may further include a series circuit of a fourth zener diode whose anode is connected to the other end of the sixth resistor and a resistor connected to one end of the fifth resistor or one end of the sixth resistor.

The current limiting circuit of the above-described LED drive circuit may further include a capacitor inserted between the other end of the sixth resistor and one end of the fifth resistor or between the other end of the sixth resistor and one end of the sixth resistor.

The above-described LED drive circuit may further include a second LED string formed by a plurality of LEDs being connected in series and connected in series to the LED string and a second current limiting circuit that limits a current that flows through the second LED string to a second upper limit current value or smaller.

The second current limiting circuit of the above-described LED drive circuit may have a second current input terminal and a second current output terminal connected between the second LED string and the current limiting circuit and when the voltage at the second current input terminal viewed from the second current output terminal rises, may decrease the second upper limit current value in accordance with an amount of rise in the voltage.

The current limiting circuit of the above-described LED drive circuit may include a switch element, a current detection resistor, a first operational amplifier, a second operational amplifier, a fifth resistor, a seventh resistor, an eighth resistor, a ninth resistor, a first FET (Field Effect Transistor), a second FET, and a third FET, and one end of the switch element may be connected to the current input terminal, the other end thereof may be connected to one end of the current detection resistor, and the switch element may further have a control terminal, the other end of the current detection resistor may be connected to the current output terminal, a non-inverting input terminal of the second operational amplifier may be connected between the eighth resistor and the ninth resistor, an inverting input terminal thereof may be connected to one end of the current detection resistor, and an output terminal thereof may be connected to the control terminal, one end of the fifth resistor may be connected to the drain of the first FET and the other end thereof may be connected to a path from a terminal that outputs a current of the bridge rectifier circuit up to the current input terminal via the LED string, the gates of the first FET and the second FET may be connected to each other, the sources of the first FET and the second FET may be grounded, the drain of the second FET, an inverting input terminal of the first operational amplifier, the source of the third FET, the seventh resistor, and the eighth resistor may be connected to one another, the drain of the third FET may be connected to a driver power source and the gate of the third FET may be connected to an output terminal of the first operational amplifier, the seventh resistor, the eighth resistor, and the ninth resistor may be connected in series, one end of the ninth resistor may be grounded, a first reference voltage may be input to one end of the seventh resistor, and a second reference voltage lower than or equal to a voltage between the seventh resistor and the eighth resistor may be input to a non-inverting input terminal of the first operational amplifier.

According to the above-described LED drive circuit, a bright change of an LED is suppressed even if the amplitude of a full-wave rectified waveform fluctuates.

EMBODIMENTS FOR EMBODYING THE INVENTION

In the following, with reference to the attached drawings, preferred embodiments of an LED drive circuit are explained in detail. In explanation of the drawings, the same symbol is attached to the same or corresponding element and duplicated explanation is omitted. Within brackets, invention specific matter described in the claims is indicated.

First Embodiment

Figure 1:
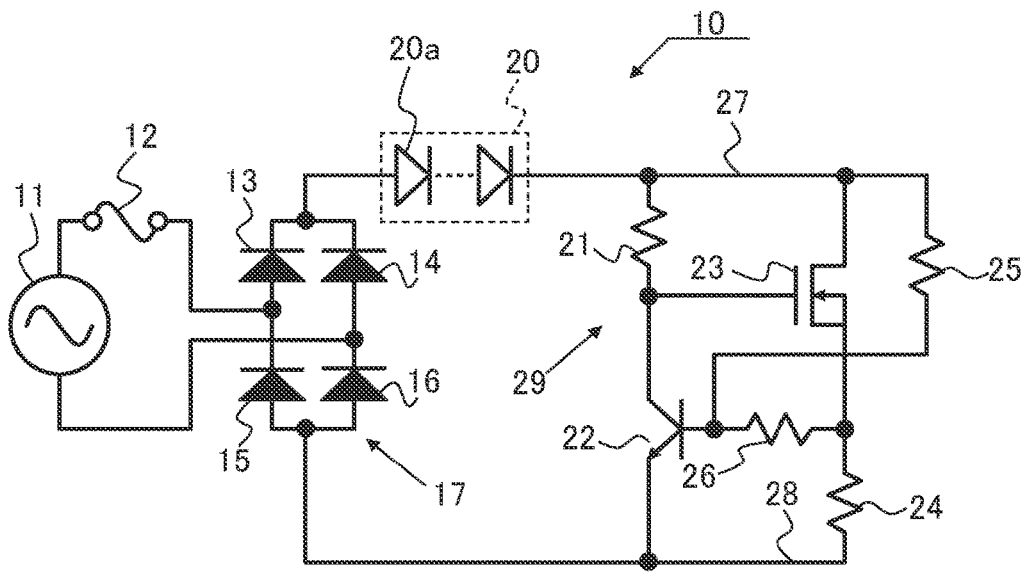
FIG. 1 is a circuit diagram of an LED drive circuit 10 of a first embodiment.

FIG. 1 is a circuit diagram of an LED drive circuit 10 of a first embodiment.

As illustrated in FIG. 1, the LED drive circuit 10 includes a bridge rectifier circuit 17, an LED string 20 in which a plurality of LEDs 20a is connected in series, and a current limiting circuit 29 having a current input terminal 27 and a current output terminal 28. A terminal that outputs a current of the bridge rectifier circuit 17 is connected to the anode of the LED string 20, the cathode of the LED string 20 is connected to the current input terminal 27, and the current output terminal 28 is connected to a terminal to which the current of the bridge rectifier circuit 17 returns. For convenience of explanation, in FIG. 1, a commercial alternating-current power source 11 and a fuse 12 are drawn additionally to the LED drive circuit 10 (it is also the same in the subsequent drawings). Further, the current input terminal 27 and the current output terminal 28 of the current limiting circuit 29 are each illustrated schematically as a part of wire connected to the current limiting circuit 29 (it is also the same in the subsequent drawings).

The bridge rectifier circuit 17 has diodes 13, 14, 15, and 16. The commercial alternating-current power source 11 is connected to an input terminal of the bridge rectifier circuit 17 via the fuse 12. A terminal to which the cathodes of the diodes 13 and 14 are connected is the terminal that outputs a current of the bridge rectifier circuit 17 and is connected to the anode of the LED string 20. A terminal to which the anodes of the diodes 15 and 16 are connected is the terminal to which the current of the bridge rectifier circuit 17 returns and is the ground of the LED drive circuit 10.

The current limiting circuit 29 includes a pull-up resistor 21, a transistor 22 (current detection element), an enhancement FET 23 (switch element), a current detection resistor 24, a first resistor 25, and a second resistor 26. The drain (one end) of the FET 23 is connected to the current input terminal 27, the source (the other end) thereof is connected to the top end (one end) of the current detection resistor 24, and the FET 23 further has the gate (control terminal). The bottom end (the other end) of the current detection resistor 24 is connected to the current output terminal 28. The base (inverting input terminal) of the transistor 22 is connected to the bottom end (one end) of the first resistor 25 and the left end (one end) of the second resistor 26 and the collector (output terminal) thereof is connected to the gate of the FET 23 and the bottom end of the pull-up resistor 21. The right end (the other end) of the second resistor 26 is connected to the top end (one end) of the current detection resistor 24.

Figure 2:
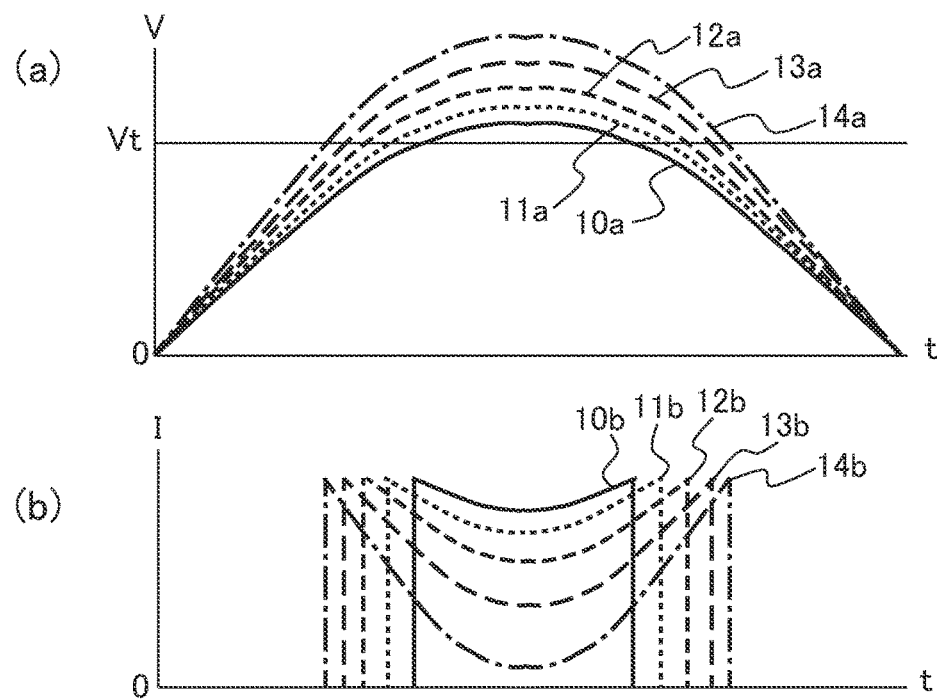
FIG. 2A and FIG. 2B are explanatory diagrams of currents that flow through the LED drive circuit 10 illustrated in FIG. 1.

Next, the operation of the LED drive circuit 10 is explained by using FIG. 2A and FIG. 2B. FIG. 2A and FIG. 2B are explanatory diagrams of currents that flow through the LED drive circuit 10 illustrated in FIG. 1 and FIG. 2A illustrates full-wave rectified waveforms each corresponding to one period and FIG. 2B illustrates currents that flow through the LED string 20. In FIG. 2A, a vertical axis V represents the voltage and a horizontal axis t represents the time. In FIG. 2B, a vertical axis I represents the current and the horizontal axis t represents the time. The horizontal axis tin FIG. 2A coincides with that in FIG. 2B. In explanation of FIG. 2A and FIG. 2B, FIG. 1 is referred to without any particular permission.

In FIG. 2A, a full-wave rectified waveform 10a corresponds to one whose effective value is 100 V. Further, full-wave rectified waveforms 11a, 12a, 13a, and 14a correspond to those whose effective values are 110 V, 120 V, 130 V, and 140 V, respectively. The full-wave rectified waveform 10a whose effective value is 100 V is a standard one and the full-wave rectified waveforms 11a to 14a correspond to the case where the voltage amplitude of the commercial alternating-current power source is large for some reason.

A voltage Vt in FIG. 2A is a threshold voltage of the LED string 20 (hereinafter, referred to as a threshold value Vt). The threshold value Vt is the sum of the forward voltage drop of each LED 20a connected in series in the LED string 20. When LEDs whose characteristics are the same are used as each LED 20a within the LED string 20, it can be said that the threshold value Vt is the product of the forward voltage drop of the LED 20a and the number of series stages of the LED 20a.

In FIG. 2B, a current waveform 10b indicates a current that flows through the LED drive circuit 10, corresponding to the full-wave rectified waveform 10a illustrated in FIG. 2A. Further, current waveforms 11b, 12b, 13b, and 14b indicate currents that flow through the LED drive circuit 10, corresponding to the full-wave rectified waveforms 11a, 12a, 13a, and 14a, respectively.

As illustrated in FIG. 2B, the current of the current waveform 10b is 0 (A) during the period in which the voltage of the full-wave rectified waveform 10a is lower than the threshold value Vt. In the phase in which the voltage of the full-wave rectified waveform 10a rises, the current of the current waveform 10b increases sharply when the voltage of the full-wave rectified waveform 10a reaches the threshold value Vt. On the contrary, in the phase in which the voltage of the full-wave rectified waveform 10a falls, the current of the current waveform 10b decreases sharply when the voltage of the full-wave rectified waveform 10a reaches the threshold value Vt. In the phase in which the voltage of the full-wave rectified waveform 10a is higher than the threshold value Vt, the current of the current waveform 10b decreases when the voltage of the full-wave rectified waveform 10a rises and increases when the voltage of the full-wave rectified waveform 10a falls.

In the full-wave rectified waveforms 11a to 14a whose amplitudes are larger than that of the full-wave rectified waveform 10a, the widths of the current waveforms 11b to 14b are greater than that of the current waveform 10b, while the degree in which the current value decreases (concavity) is large. Further, the width is great and the degree in which the current value decreases (concavity) increases as the amplitude of the full-wave rectified waveform is large.

Comparative Example

Figure 3:
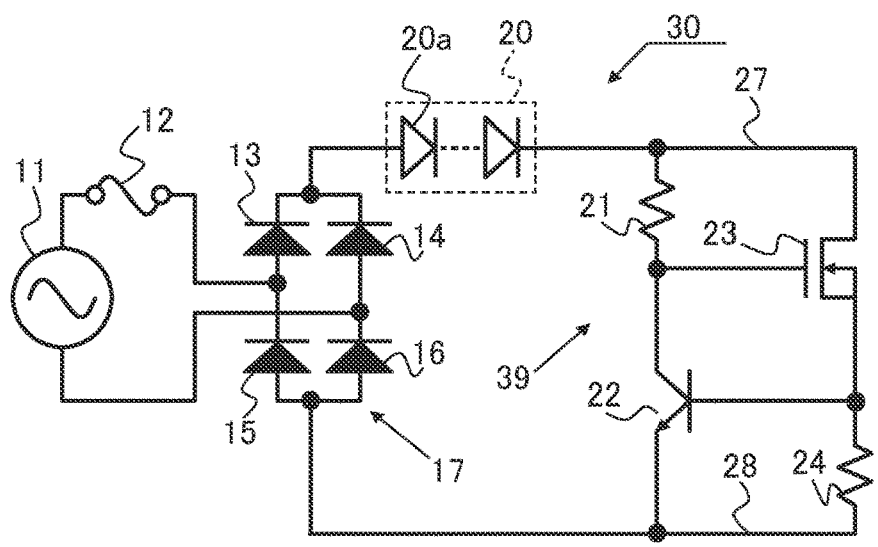
FIG. 3 is a circuit diagram of an LED drive circuit 30 in a comparative example.
Figure 4:
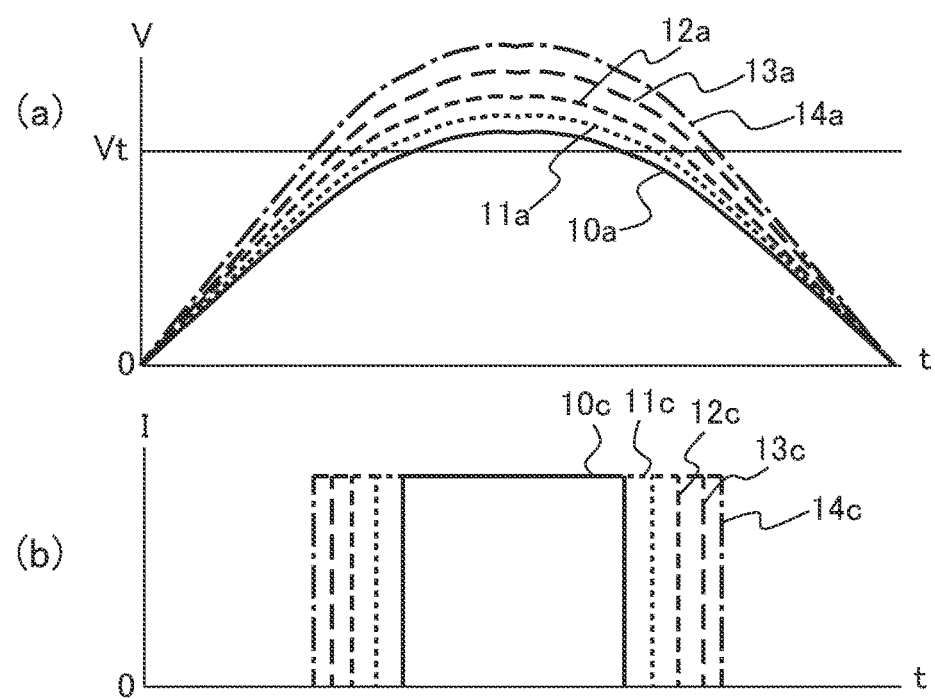
FIG. 4A and FIG. 4B are explanatory diagrams of currents that flow through the LED drive circuit 30 illustrated in FIG. 3.

FIG. 3 is a circuit diagram of an LED drive circuit 30 of a comparative example. FIG. 4A and FIG. 4B are explanatory diagrams of currents that flow through the LED drive circuit 30 illustrated in FIG. 3, and FIG. 4A illustrates full-wave rectified waveforms each corresponding to one period and FIG. 4B illustrates currents that flow through the LED string 20. In FIG. 4A, the vertical axis V represents the voltage and the horizontal axis t represents the time. In FIG. 4B, the vertical axis I represents the current and the horizontal axis t represents the time. The horizontal axis tin FIG. 4A coincides with that in FIG. 4B. In explanation of FIG. 4A and FIG. 4B, FIG. 3 is referred to without any particular permission.

The difference between the LED drive circuit 30 illustrated in FIG. 3 and the LED drive circuit 10 illustrated in FIG. 1 lies only in that a current limiting circuit 39 of the LED drive circuit 30 does not include the first resistor 25 and the second resistor 26 of the LED drive circuit 10 (see FIG. 1) and the top end of the current detection resistor 24 is connected directly to the base of the transistor 22 in the current limiting circuit 39. The current limiting circuit 39 having the pull-up resistor 21, the transistor 22, the FET 23, and the current detection resistor 24 is widely known. When a silicon transistor is used, the current limiting circuit 39 limits the value of a current that flows between the drain and the source of the FET 23 to an upper limit value or smaller by performing feedback control so that the voltage between the base and the emitter is kept at 0.6 V.

FIG. 4A is the same as FIG. 2A and the full-wave rectified waveforms 10a to 14a correspond to those whose effective values are 100 V, 110 V, 120 V, 130 V, and 140 V, respectively.

In FIG. 4B, a current waveform 10c indicates a current that flows through the LED drive circuit 30, corresponding to the full-wave rectified waveform 10a illustrated in FIG. 4A. Further, current waveforms 11c, 12c, 13c, and 14c indicate currents that flow through the LED drive circuit 30, corresponding to the full-wave rectified waveforms 11a, 12a, 13a, and 14a, respectively.

As illustrated in FIG. 4B, the current of the current waveform 10c is 0 (A) during the period in which the voltage of the full-wave rectified waveform 10a is lower than the threshold value Vt. In the phase in which the voltage of the full-wave rectified waveform 10a rises, the current of the current waveform 10c increases sharply when the voltage of the full-wave rectified waveform 10a reaches the threshold value Vt. On the contrary, in the phase in which the voltage of the full-wave rectified waveform 10a falls, the current of the current waveform 10c decreases sharply when the voltage of the full-wave rectified waveform 10a reaches the threshold value Vt. In the phase in which the voltage of the full-wave rectified waveform 10a is higher than the threshold value Vt, the current of the current waveform 10c is constant.

In the full-wave rectified waveforms 11a to 14a whose amplitudes are larger than that of the full-wave rectified waveform 10a, only the widths of the current waveforms 11c to 14c thereof are greater than that of the current waveform 10c and the upper limit value of the current is constant.

As described above, in the LED drive circuit 30 illustrated as a comparative example, when the amplitude of the full-wave rectified waveform fluctuates, the turned-on period of the LED string 20 also fluctuates, but the upper limit value of the current waveform is constant. Thus, brightness changes accompanying fluctuations in the full-wave rectified waveform.

(Features of First Embodiment Relative to Comparative Example)

By a comparison with the LED drive circuit 30 illustrated in FIG. 3, the operation of the LED drive circuit 10 illustrated in FIG. 1 is explained. In the LED drive circuit 10, as in the LED drive circuit 30, when the amplitude of the full-wave rectified waveform fluctuates, the turned-on period of the LED string 20 also fluctuates. However, unlike the LED drive circuit 30, in the LED drive circuit 10, a concavity is provided in the current waveform (for example, the current waveforms 10b to 14b in FIG. 2B) so as to cancel fluctuations in the turned-on period. Thus, a bright change accompanying fluctuations in the full-wave rectified waveform is suppressed.

Further, while part of the current that flows through the FET 23 flows into the base of the transistor 22 in the LED drive circuit 30, the current that flows into the base of the transistor 22 from the first resistor 25 is added to the current in the LED drive circuit 10. In other words, in the LED drive circuit 10, the current that flows into the base of the transistor 22 is the sum of the current that flows in from the first resistor 25 and the current that flows in from the second resistor 26. As a result, the transistor 22 of the current limiting circuit 29 included in the LED drive circuit 10 operates as a kind of inverting addition circuit (the base of the transistor 22 corresponds to the inverting input terminal). Thus, in the current limiting circuit 29 illustrated in FIG. 1, the upper limit voltage is set so that the voltage between the base and the emitter of the transistor 22 is kept at 0.6 V. In other words, when the voltage at the current input terminal 27 is high, the current that flows through the first resistor 25 increases and the current that flows through the second resistor 26 decreases. Thus, the current that flows through the LED string 20 decreases.

In the LED drive circuit 10, the first resistor 25 and the second resistor 26 are set so as to have resistance values larger than that of the current detection resistor 24. Thus, the maximum value of the current that is limited by the current limiting circuit 29 is determined substantially by the current detection resistor 24. On the other hand, the degree (the concavity of the current waveform 10b and the like) in which the current is suppressed in accordance with the voltage of the full-wave rectified waveform is determined substantially by the values of the first resistor 25 and the second resistor 26 and the ratio therebetween.

In the LED drive circuit 10, the top ends of the pull-up resistor 21 and the first resistor 25 are connected to the current input terminal 27. The top ends of the pull-up resistor 21 and the first resistor 25 can be connected to any portion of the path from the terminal that outputs a current of the bridge rectifier circuit 17 up to the current input terminal 27 via the LED string 20, since the voltage fluctuates in the same phase as that of the full-wave rectified waveform in the path. However, the voltage at the current input terminal 27 and the voltage at an arbitrary point in the path are not necessarily equal, and therefore when the top ends of the pull-up resistor 21 and the first resistor 25 are connected to a position different from that in the LED drive circuit 10, it is necessary to adjust the values of the pull-up resistor 21 and the first resistor 25. Further, if the top end of the first resistor 25 is connected to a portion on the downstream side of the cathode of the LED string 20 (in FIG. 1, it is equal to the current input terminal 27), it is possible to suppress bright fluctuations accompanying fluctuations in the commercial alternating-current power source 11 may be suppressed, and further fluctuations in brightness may be suppressed when the threshold value Vt of the LED string 20 fluctuates by changing temperature.

Although the LED drive circuit 10 suppresses bright fluctuations accompanying fluctuations in the effective value of the commercial alternating-current power source 11, the LED drive circuit 10 may suppress fluctuations in electric power.

Second Embodiment

Figure 5:
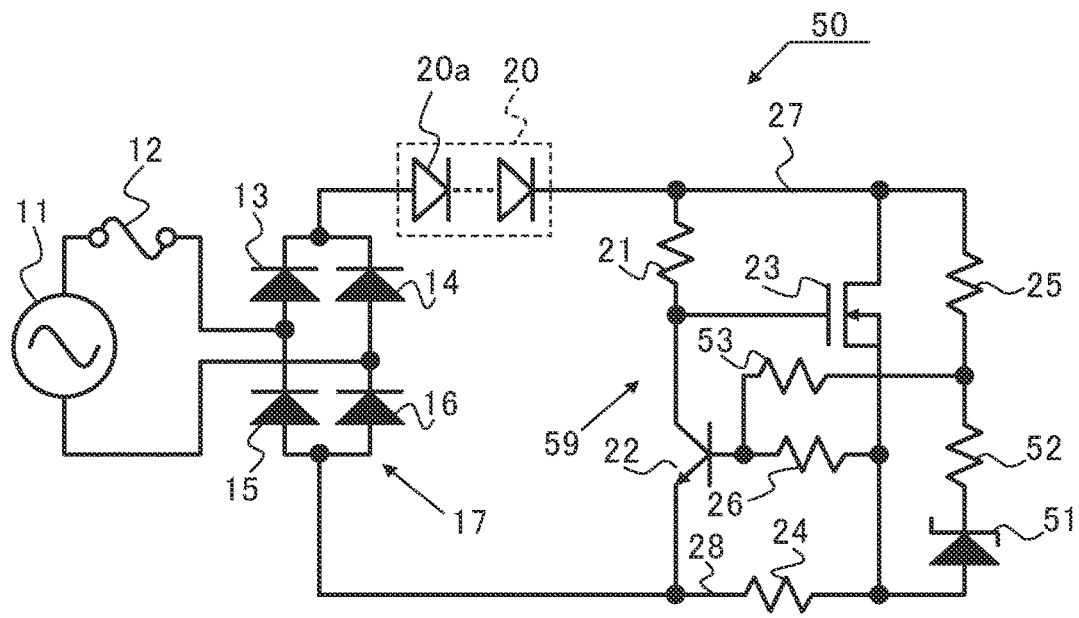
FIG. 5 is a circuit diagram of an LED drive circuit 50 of a second embodiment.
Figure 6:
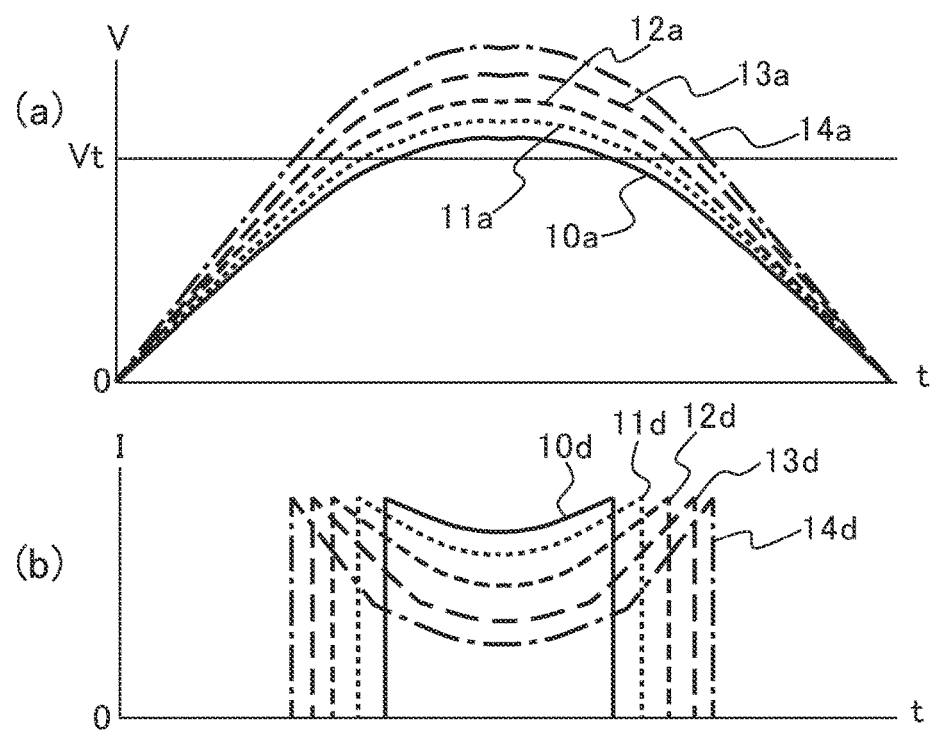
FIG. 6A and FIG. 6B are explanatory diagrams of currents that flow through the LED drive circuit 50 illustrated in FIG. 5.

FIG. 5 is a circuit diagram of an LED drive circuit 50 of a second embodiment. The same number is attached to the same member as that of the LED drive circuit 10 illustrated in FIG. 1 and explanation is omitted. FIG. 6A and FIG. 6B are explanatory diagrams of currents that flow through the LED drive circuit 50 illustrated in FIG. 5 and FIG. 6A illustrates full-wave rectified waveforms each corresponding to one period and FIG. 6B illustrates currents that flow through the LED string 20. In FIG. 6A, the vertical axis V represents the voltage and the horizontal axis t represents the time. In FIG. 6B, the vertical axis I represents the current and the horizontal axis t represents the time. The horizontal axis t in FIG. 6A coincides with that in FIG. 6B. When the operation of the LED drive circuit 50 is explained by using FIG. 6A and FIG. 6B, FIG. 5 is referred to without any particular permission.

The difference between the LED drive circuit 50 illustrated in FIG. 5 and the LED drive circuit 10 illustrated in FIG. 1 lies only in that a zener diode 51 (second zener diode), a third resistor 52, and a fourth resistor 53 are added in a current limiting circuit 59 of the LED drive circuit 50 compared to the LED drive circuit 10. In FIG. 5, since the current detection resistor 24 is rotated by 90° with respect to that in FIG. 1, the top end (one end) and the bottom end (the other end) of the current detection resistor 24 in FIG. 1 are the right end (one end) and the left end (the other end), respectively, of the current detection resistor 24 in FIG. 5.

As illustrated in FIG. 5, the third resistor 52 is inserted between the cathode of the zener diode 51 and the bottom end (one end) of the first resistor 25. The fourth resistor 53 is inserted between the bottom end of the first resistor 25 and the left end (one end) of the second resistor 26. The anode of the zener diode 51 is connected to the right end of the current detection resistor 24.

Next, by using FIG. 6A and FIG. 6B, the operation of the LED drive circuit 50 is explained. FIG. 6A is the same as FIG. 2A. Current waveforms 10d, 11d, 12d, 13d, and 14d illustrated in FIG. 6B correspond to the full-wave rectified waveforms 10a, 11a, 12a, 13a, and 14a, respectively, and are currents that flow through the LED drive circuit 50.

As illustrated in FIG. 6B, the currents of the current waveforms 10d to 14d are 0 (A) during the period in which the voltages of the full-wave rectified waveforms 10a to 14a are lower than the threshold value Vt. In the phase in which the voltages of the full-wave rectified waveforms 10a to 14a rise, the currents of the current waveforms 10d to 14d increase sharply when the voltages of the full-wave rectified waveforms 10a to 14a reach the threshold value Vt. On the contrary, in the phase in which the voltages of the full-wave rectified waveforms 10a to 14a fall, the currents of the current waveforms 10d to 14d decrease sharply when the voltages of the full-wave rectified waveforms 10a to 14a reach the threshold value Vt. In the phase in which the voltages of the full-wave rectified waveforms 10a to 14a are higher than the threshold value Vt, the currents of the current waveforms 10d to 14d decrease when the voltages of the full-wave rectified waveforms 10a to 14a rise, and the currents of the current waveforms 10d to 14d increase when the voltages of the full-wave rectified waveforms 10a to 14a fall. The concavities in the current waveforms 10d to 14d are larger in the order.

The difference between FIG. 6B and FIG. 2B lies in that the concavities of the current waveforms 13d and 14d illustrated in FIG. 6B are smaller than the concavities of the current waveforms 13b and 14b illustrated in FIG. 2B, since a current flows through the zener diode 51 when the potential difference between the bottom end of the first resistor 25 and the right end of the current detection resistor 24 exceeds a predetermined value (breakdown value). The third resistor 52 or the fourth resistor 53 may be omitted. However, the third resistor 52 functions so as to make curvilinear the bottoms of the concavities of the current waveforms 13d and 14d and if the third resistor 52 is omitted, the bottoms of the concavities are flat. The fourth resistor 53 is for adjusting characteristics in accordance with the insertion of the zener diode 51 and the third resistor 52.

As described above, by having the zener diode 51, the third resistor 52, and the fourth resistor 53, the LED drive circuit 50 suppresses the concavity of the current waveform from becoming too large compared to that of the LED drive circuit 10 illustrated in FIG. 1 when the amplitude of the full-wave rectified waveform is great considerably. Thus, the LED drive circuit 50 may avoid a situation in which the LED is dark when the effective value of the full-wave rectified waveform increases considerably.

Third Embodiment

Figure 7:
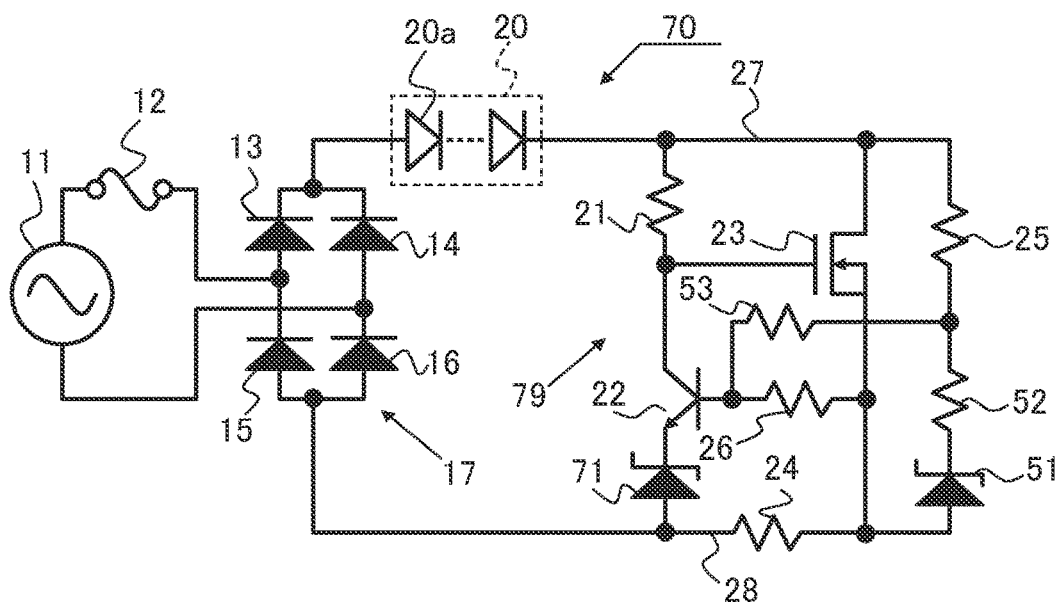
FIG. 7 is a circuit diagram of an LED drive circuit 70 of a third embodiment.

FIG. 7 is a circuit diagram of an LED drive circuit 70 of a third embodiment. The same number is attached to the same member as that of the LED drive circuit 50 illustrated in FIG. 5 and explanation is omitted.

The difference between the LED drive circuit 70 illustrated in FIG. 7 and the LED drive circuit 50 illustrated in FIG. 5 lies only in that a zener diode 71 (first zener diode) is added between the emitter of the transistor 22 and the current output terminal 28 in a current limiting circuit 79 of the LED drive circuit 70. Thus, the characteristics of the LED drive circuit 70 and those of the LED drive circuit 50 are substantially equal. The cathode of the zener diode 71 is connected to the emitter of the transistor 22 and the anode thereof is connected to the current output terminal 28.

In the LED drive circuit 70, when a current is being limited, the voltage between the base of the transistor 22 and the current output terminal 28 is "0.6 V+(breakdown voltage of the zener diode 51)". Thus, the LED drive circuit 70 has characteristics that it is easier to set a resistance value and the like than in the LED drive circuit 50.

Fourth Embodiment

Figure 8:
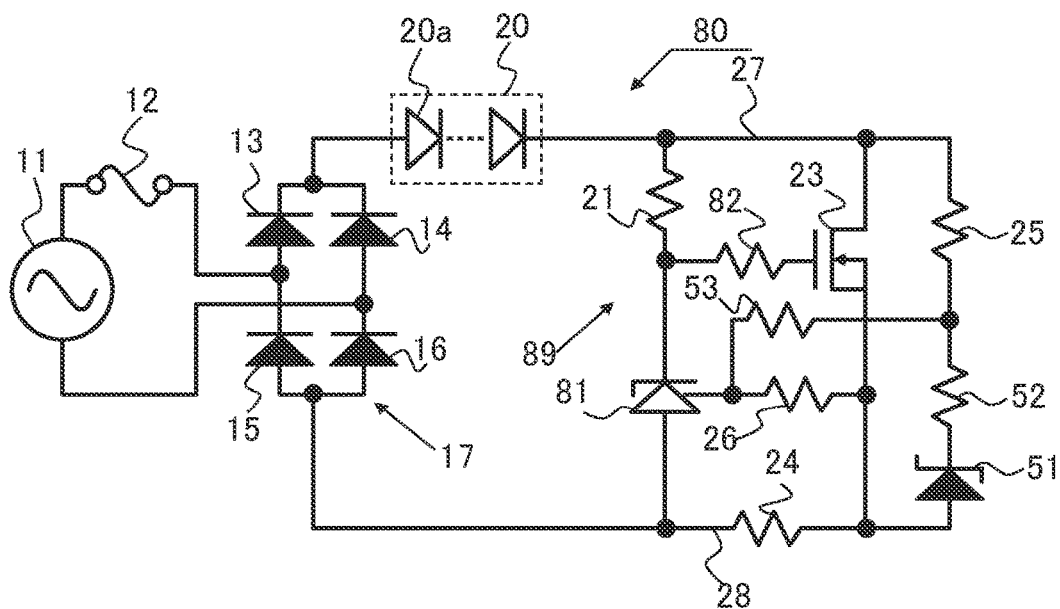
FIG. 8 is a circuit diagram of an LED drive circuit 80 of a fourth embodiment.
Figure 9:
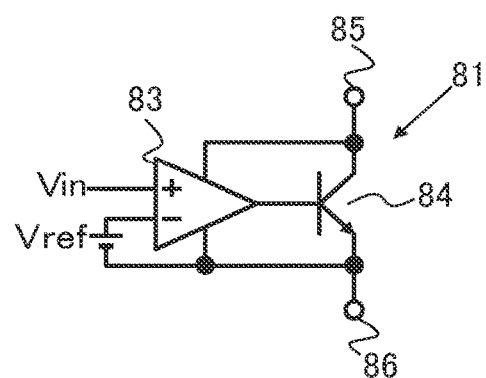
FIG. 9 is a circuit diagram of a shunt regulator 81 illustrated in FIG. 8.

FIG. 8 is a circuit diagram of an LED drive circuit 80 of a fourth embodiment and FIG. 9 is a circuit diagram of a shunt regulator in FIG. 8. The same number is attached to the same member as that of the LED drive circuit 70 illustrated in FIG. 7 and explanation is omitted.

The difference between the LED drive circuit 80 illustrated in FIG. 8 and the LED drive circuit 70 illustrated in FIG. 7 lies only in that the transistor 22 and the zener diode 71 included in the LED drive circuit 70 are replaced with a shunt regulator 81 in a current limiting circuit 89 of the LED drive circuit 80 and that a gate resistor 82 is inserted between the pull-up resistor 21 and the gate of the FET 23 in the current limiting circuit 89. Thus, the characteristics of the LED drive circuit 80 and those of the LED drive circuit 70 are substantially equal.

As illustrated in FIG. 9, the shunt regulator 81 includes an operational amplifier 83 (comparator), a transistor 84, and a reference voltage source Vref, and has a voltage input terminal Vin, a cathode side terminal 85, and an anode side terminal 86. When the voltage of the voltage input terminal Vin is lower than the voltage of the reference voltage source Vref, the transistor 84 is in the off state. When the voltage of the voltage input terminal Vin is higher than the voltage of the reference voltage source Vref, the transistor 84 enters the on state and a current flows from the cathode side terminal 85 toward the anode side terminal 86.

As illustrated in FIG. 8, the voltage input terminal Vin of the shunt regulator 81 is connected to the left end of the second resistor 26 and the left end of the fourth resistor 53, the cathode side terminal 85 thereof is connected to the bottom end of the pull-up resistor 21, and the anode side terminal 86 thereof is connected to the current output terminal 28. As illustrated in FIG. 9, the voltage input terminal Vin is connected to a positive value input side (+ side) of the operational amplifier 83, but the output of the operational amplifier 83 is connected to the base of the transistor 84, and therefore in the shunt regulator 81 as a whole, the voltage input terminal Vin is the inverting input terminal.

It is easy to get a product of the shunt regulator 81 in which the voltage of the reference voltage source Vref is lower than or equal to 5 V, and therefore the reference voltage source Vref unlikely receive the influence of temperature by using the shunt regulator 81. Thus, by using the shunt regulator 81, the setting of a resistance value and the like is easy, and the LED drive circuit 80 is resistant to environmental fluctuations compared to the LED drive circuit 70 illustrated in FIG. 7. The gate resistor 82 prevents oscillation as well as protecting the gate of the FET 23.

Fifth Embodiment

Figure 10:
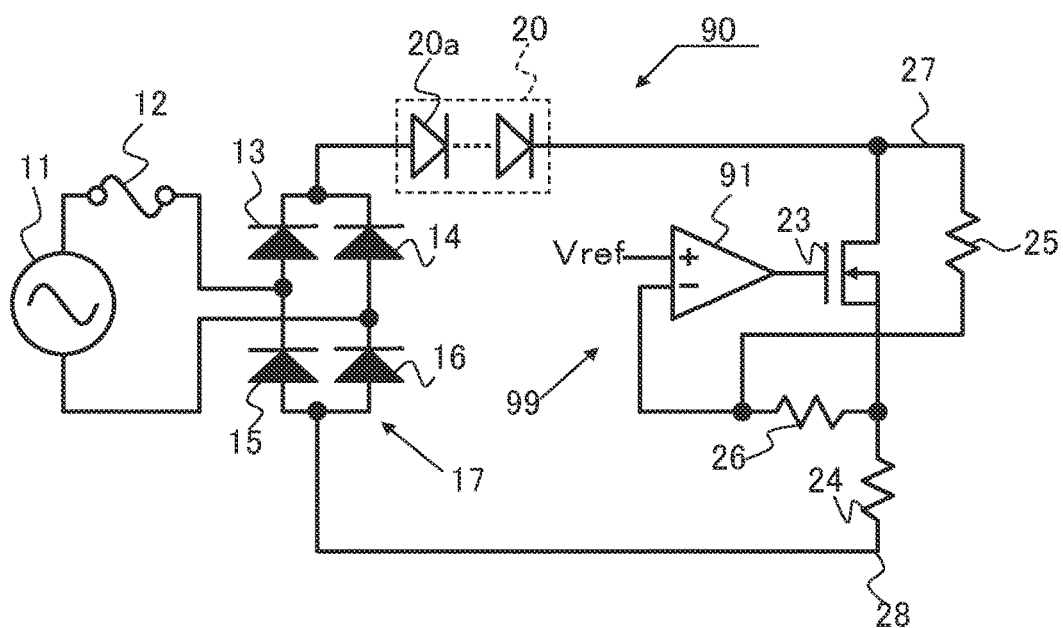
FIG. 10 is a circuit diagram of an LED drive circuit 90 of a fifth embodiment.

FIG. 10 is a circuit diagram of an LED drive circuit 90 of a fifth embodiment. The same number is attached to the same member as that of the LED drive circuit 10 illustrated in FIG. 1 and explanation is omitted.

The difference between the LED drive circuit 90 illustrated in FIG. 10 and the LED drive circuit 10 illustrated in FIG. 1 lies only in that the transistor 22 and the pull-up resistor 21 of the LED drive circuit 10 are replaced with an operational amplifier 91 in a current limiting circuit 99 of the LED drive circuit 90. Thus, the characteristics of the LED drive circuit 90 and those of the LED drive circuit 10 are substantially equal. Vref, which is a reference voltage, is input to the positive value terminal (+ side) of the operational amplifier 91 and the inverting input terminal (− side) is connected to the bottom end of the first resistor 25 and the left end of the second resistor 26. The current limiting circuit 99 is formed by adding the first resistor 25 and the second resistor 26 to a well-known current limiting circuit having an operational amplifier, a current detection resistor, and an FET (or transistor).

In the LED drive circuit 10 illustrated in FIG. 1, the voltage between the base and the emitter corresponds to the reference voltage source Vref, and therefore the circuit is simple. On the other hand, in the LED drive circuit 90, it is necessary to prepare a reference voltage source, but a high-performance reference voltage source that can be set to any voltage can be used, and therefore the setting of a resistance value and the like is easy, and, the LED drive circuit 90 is resistant to environmental fluctuations compared to the LED drive circuit 10.

Sixth Embodiment

Figure 11:
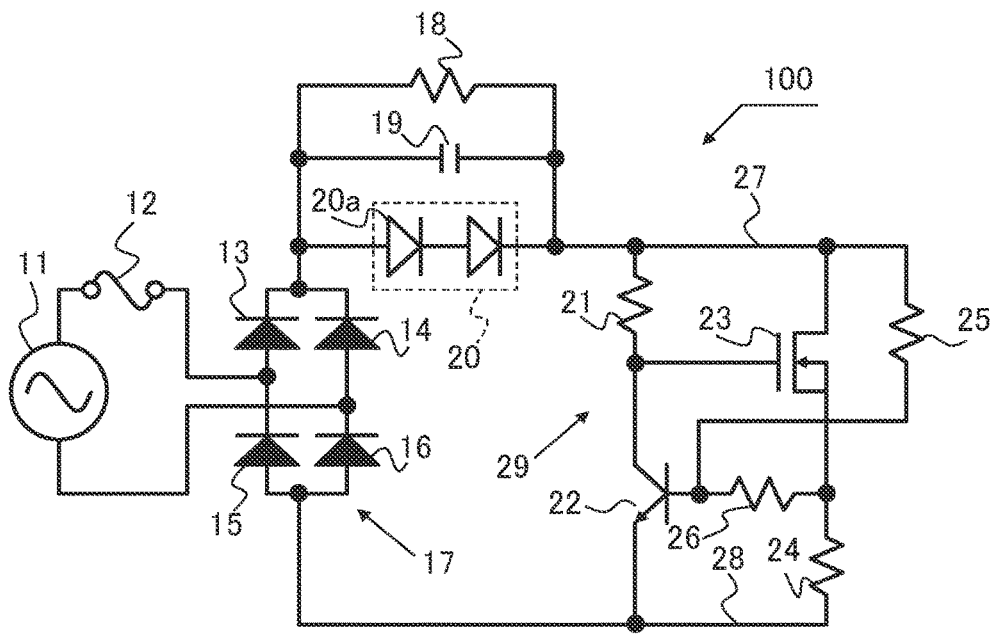
FIG. 11 is a circuit diagram of an LED drive circuit 100 of a sixth embodiment.

FIG. 11 is a circuit diagram of an LED drive circuit 100 of a sixth embodiment. The same number is attached to the same member as that of the LED drive circuit 10 illustrated 1 and explanation is omitted.

The difference between the LED drive circuit 100 illustrated in FIG. 11 and the LED drive circuit 10 illustrated in FIG. 1 lies only in that the capacitor 19 and the resistor 18 are connected in parallel to the LED string 20 in the LED drive circuit 100.

In the LED drive circuit 100, during the period also in which the voltage of the full-wave rectified waveform does not reach the threshold value Vt of the LED string 20, the LED string 20 turns on due to discharge of the capacitor 19, and therefore flicker decreases. During the period, the current path is a path from the left end of the capacitor 19 up to the right end of the capacitor 19 via the LED string 20, and therefore no current flows through the current limiting circuit 29. Thus, as for the current limiting circuit 29 alone, the operation and characteristics of the LED drive circuit 100 and those of the LED drive circuit 10 are substantially equal. The resistor 18 is used for discharge of the capacitor 19.

As described previously, the LED drive circuit 100 may decrease flicker as well as to suppress bright fluctuations for fluctuations in the full-wave rectified waveform. By connecting the capacitor 19 and the resistor 18 in parallel to the LED string 20 in the second to fifth embodiments, as in the sixth embodiment, the same effect is obtained.

In the first to sixth embodiments, the mechanism is explained that suppresses bright fluctuations when the effective value of the full-wave rectified waveform increases. For fluctuations that decrease the effective value of the full-wave rectified waveform, the concavity of the current waveform is small and bright fluctuations are suppressed. However, if fluctuations occur so as to decrease the effective value of the full-wave rectified waveform, the width of the current waveform is narrow sharply. Thus, when bright fluctuations cannot be suppressed by the method of the present invention alone, it is better to change the threshold value Vt by changing the number of series stages of the LED string.

Seventh Embodiment

The LED drive circuits 10, 50, 70, and 80 illustrated in FIG. 1, FIG. 5, FIG. 7, and FIG. 8 premise that individual electronic members are mounted on the circuit substrate to form the current limiting circuit. Further, if the current limiting circuit may be integrated (turned into IC), the mounting area can be reduced and the mounting procedure can be simplified. Thus, as a seventh embodiment, an LED drive circuit 210 including a current limiting circuit suitable to integration is explained by using FIG. 12 and FIG. 13.

Figure 12:
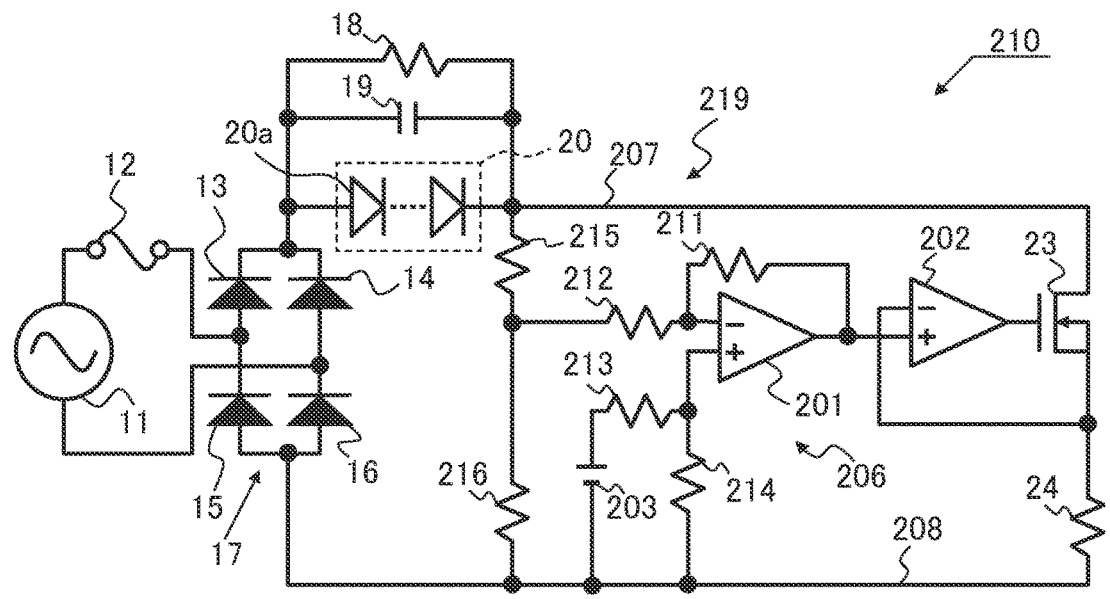
FIG. 12 is a circuit diagram of an LED drive circuit 210 of a seventh embodiment.

FIG. 12 is a circuit diagram of the LED drive circuit 210 of the seventh embodiment.

As illustrated in FIG. 12, the LED drive circuit 210 includes the bridge rectifier circuit 17, the LED string 20 in which a plurality of LEDs 20a is connected in series, and a current limiting circuit 219 having a current input terminal 207 and a current output terminal 208. A terminal that outputs a current of the bridge rectifier circuit 17 is connected to the anode of the LED string 20, the cathode of the LED string 20 is connected to the current input terminal 207, and the current output terminal 208 is connected to a terminal to which the current of the bridge rectifier circuit 17 returns. Further, as in the LED drive circuit 100 illustrated in FIG. 11, the resistor 18 and the capacitor 19 are connected in parallel to the LED string 20. For convenience of explanation, in FIG. 12, the commercial alternating-current power source 11 and the fuse 12 are drawn additionally to the LED drive circuit 210 (it is also the same in the subsequent drawings). Further, the current input terminal 207 and the current output terminal 208 of the current limiting circuit 219 are represented schematically as a part of wire that is connected to the current limiting circuit 219 (it is also the same in the subsequent drawings).

The bridge rectifier circuit 17, the commercial alternating-current power source 11, and the fuse 12 are equivalent to the bridge rectifier circuit 17, the commercial alternating-current power source 11, and the fuse 12 of the LED drive circuit 10 illustrated in FIG. 1, and therefore explanation is omitted. Further, the resistor 18 and the capacitor 19 are equivalent to the resistor 18 and the capacitor 19 of the LED drive circuit 100 illustrated in FIG. 11, and therefore explanation is omitted.

The current limiting circuit 219 includes the enhancement FET 23 (switch element), the current detection resistor 24, an inverting amplifier circuit 206, a second operational amplifier 202, a fifth resistor 215, and a sixth resistor 216.

The inverting amplifier circuit 206 has a first operational amplifier 201, resistors 211, 212, 213, and 214, and a reference voltage source 203. The left end of the resistor 211 and the right end of the resistor 212 are connected to the inverting input terminal of the first operational amplifier 201, the right end of the resistor 213 and the top end of the resistor 214 are connected to the non-inverting input terminal thereof, and the right end of the resistor 211 is connected to the output terminal thereof. The left end of the resistor 213 is connected to the + side of the reference voltage source 203 and the bottom end of the resistor 214 and one end of the reference voltage source 203 are connected to the current output terminal 208. The first operational amplifier 201 and the second operational amplifier 202 slightly depend on the power source voltage and operate on about several V to ten and several V. Thus, the power sources of these elements are not illustrated schematically (it is also the same in the following diagrams).

The drain (one end) of the FET 23 is connected to the current input terminal 207 and the source (the other end) thereof is connected to the top end (one end) of the current detection resistor 24, and the FET 23 further has a gate (control terminal). The bottom end (the other end) of the current detection resistor 24 is connected to the current output terminal 208. The left end of the resistor 212, which is the input terminal of the inverting amplifier circuit 206, is connected to the bottom end (one end) of the fifth resistor 215 and the top end (one end) of the sixth resistor 216, and the output terminal of the first operational amplifier 201, which is the output terminal of the inverting amplifier circuit 206, is connected to the non-inverting input terminal of the second operational amplifier 202. The inverting input terminal of the second operational amplifier 202 is connected to the top end (one end) of the current detection resistor 24. The top end (the other end) of the fifth resistor 215 is connected to the current input terminal 207 and the bottom end (the other end) of the sixth resistor 216 is connected to the current output terminal 208. The fifth resistor 215 and the sixth resistor 216 are connected in series between the current input terminal 207 and the current output terminal 208.

Figure 13:
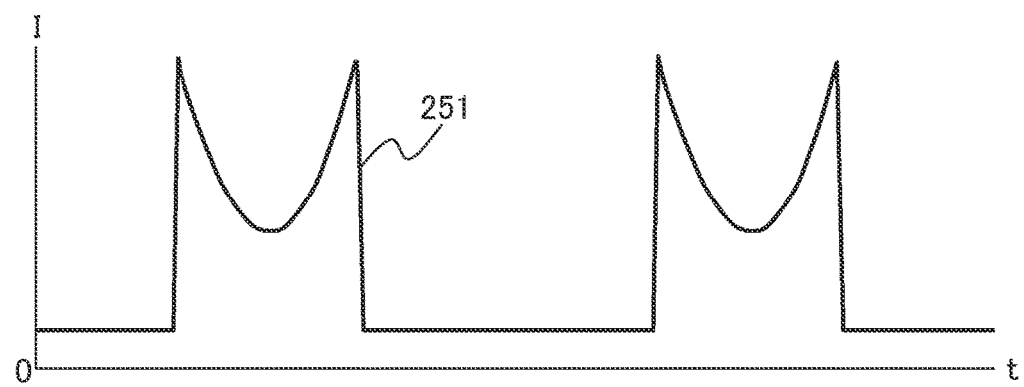
FIG. 13 is an explanatory diagram of a current that flows through a current limiting circuit 219 of the LED drive circuit 210.

Next, by using FIG. 13, the operation of the LED drive circuit 210 is explained. FIG. 13 is an explanatory diagram of a current that flows through the current limiting circuit 219 of the LED drive circuit 210. The current that flows through the current limiting circuit 219 is the current that flows through the current detection resistor 24 and the currents that flow through the fifth resistor 215, the sixth resistor 216, the first operational amplifier 201, the second operational amplifier 202, and the reference voltage source 203 are ignored (it is also the same in the following drawings). In FIG. 13, the vertical axis I represents the current and the horizontal axis t represents the time. In explanation of FIG. 13, FIG. 12 is referred to without any particular permission.

In FIG. 13, a current waveform 251 when a full-wave rectified waveform corresponding to two periods, whose effective value is 200 V, is output from the bridge rectifier circuit 17 is illustrated. In the phase in which the voltage of the full-wave rectified waveform rises, the current begins to flow sharply when the voltage thereof reaches the threshold voltage of the LED string 20 (rise of the current waveform 251). When the voltage of the full-wave rectified waveform further rises, the output voltage of the inverting amplifier circuit 206 falls and the current that flows through the current detection resistor 24 decreases (left side of the concavity of the current waveform 251). When the voltage of the full-wave rectified waveform passes the peak and begins to fall, the output voltage of the inverting amplifier circuit 206 rises and the current that flows through the current detection resistor 24 also increases (right side of the concavity of the current waveform 251). In the phase in which the voltage of the full-wave rectified waveform falls, when the voltage thereof reaches the threshold voltage of the LED string 20, the current decrease sharply (fall of the current waveform 251).

When the output voltage of the inverting amplifier circuit 206 is taken to be V (V) and the resistance value of the current detection resistor 24 is taken to be R (Ω), a current I (A) that flows through the current detection resistor 24 is $I=V/R.$ In the LED drive circuit 210, as in the LED drive circuit 10 and the like, when the effective value of the full-wave rectified waveform increases, the concavity of the current waveform is large while the width of the current waveform is great. Thus, in the LED drive circuit 210, the amount of emitted light (power consumption) is kept substantially constant for fluctuations in the effective value of the full-wave rectified waveform.

The number of elements of the current limiting circuit 219 of the LED drive circuit 210 is large compared to that of the current limiting circuit 29 of the LED drive circuit 10, but the current limiting circuit 219 is formed of only standard members and circuits, and therefore there is no difficulty in integration (turning into IC). The top end of the fifth resistor 215 is connected to the current input terminal 207 of the current limiting circuit 219 in the LED drive circuit 210, but the top end of the fifth resistor 215 may be connected to the output terminal of the bridge rectifier circuit 17. However, when the top end of the fifth resistor 215 is connected to the output terminal of the bridge rectifier circuit 17, it is necessary to adjust the resistance values of the fifth resistor 215 and the sixth resistor 216. If the top end of the fifth resistor 215 is connected to the current input terminal 207 of the current limiting circuit 219, the number of terminals of an IC may be reduced at the time of turning into IC.

Eighth Embodiment

Figure 14:
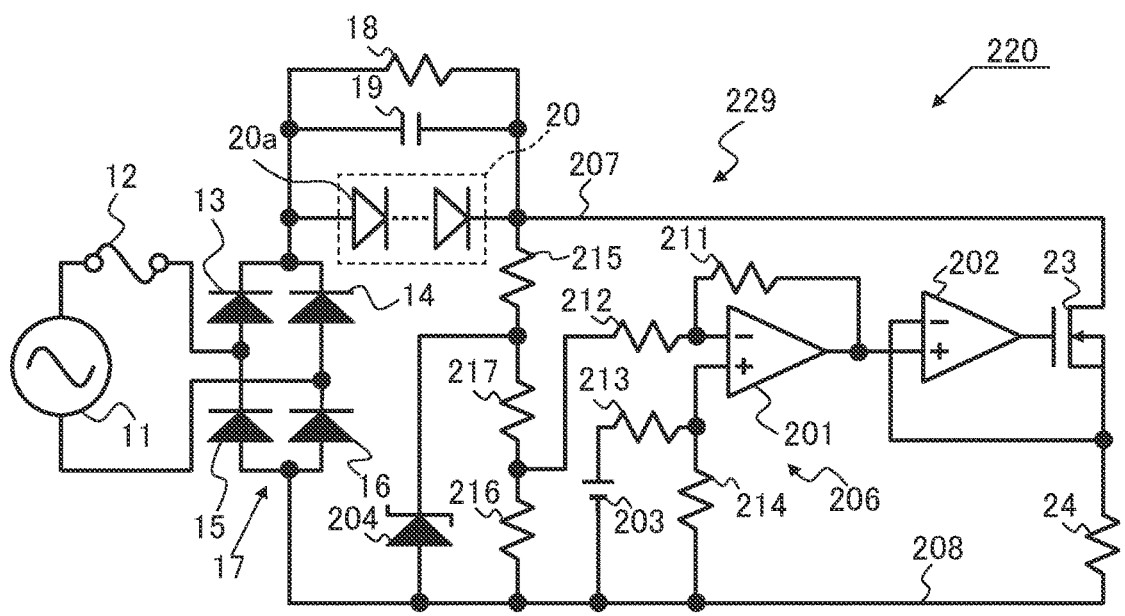
FIG. 14 is a circuit diagram of an LED drive circuit 220 of an eighth embodiment.
Figure 15:
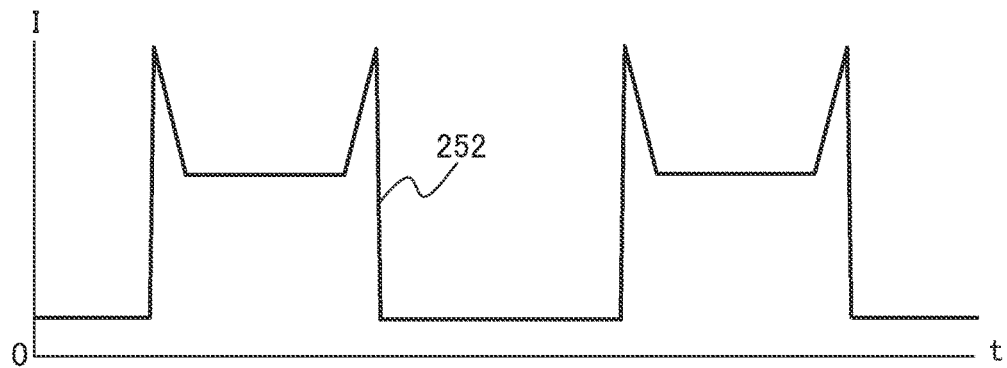
FIG. 15 is an explanatory diagram of a current that flows through a current limiting circuit 229 of the LED drive circuit 220.

FIG. 14 is a circuit diagram of an LED drive circuit 220 of an eighth embodiment. The same number is attached to the same member as that of the LED drive circuit 210 illustrated in FIG. 12 and explanation is omitted. FIG. 15 is an explanatory diagram of a current that flows through a current limiting circuit 229 of the LED drive circuit 220, illustrating two periods of a full-wave rectified waveform. In FIG. 15, the vertical axis I represents the current and the horizontal axis t represents the time.

The difference between the LED drive circuit 220 illustrated in FIG. 14 and the LED drive circuit 210 illustrated in FIG. 12 lies only in that a zener diode 204 (third zener diode) and a resistor 217 are added in the current limiting circuit 229 of the LED drive circuit 220 compared to the LED drive circuit 210. The anode of the zener diode 204 is connected to the bottom end (the other end, the current output terminal 208) of the sixth resistor 216 and the cathode thereof is connected to the bottom end (one end) of the fifth resistor 215. The resistor 217 is inserted between the bottom end of the fifth resistor 215 and the top end of the sixth resistor 216. The left end of the resistor 212, which is the input terminal of the inverting amplifier circuit 206, is connected to the top end of the sixth resistor 216.

Depending on the characteristics of the zener diode 204, no resistor may be inserted, and the cathode of the zener diode 204 may be connected to the bottom end of the resistor 217. Further, the left end of the resistor 212 may be connected to the bottom end of the fifth resistor 215. Further, an equivalent circuit may be used, such as the shunt regulator illustrated FIG. 8 and FIG. 9, at the time of turning into IC in place of the zener diode 204.

As illustrated in FIG. 15, in a current waveform 252 of a current that flows through the current limiting circuit 229 included in the LED drive circuit 220, the bottom of the concavity is flat since the cathode voltage of the zener diode 204 does not rise above the breakdown value. In the LED drive circuit 220, the concavity of the current waveform 252 is prevented from becoming too large by the zener diode 204. In FIG. 15, the effective value of the commercial alternating-current power source is 230 V, and therefore the width of the current waveform 252 is greater than the width of the current waveform 251 illustrated in FIG. 13.

Ninth Embodiment

Figure 16:
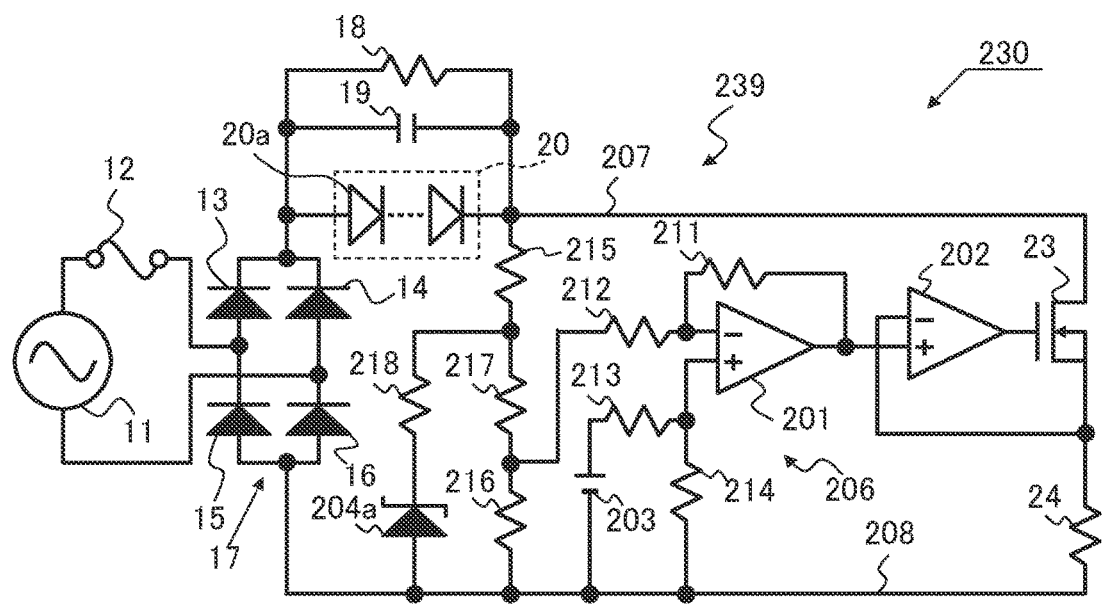
FIG. 16 is a circuit diagram of an LED drive circuit 230 of a ninth embodiment.
Figure 17:
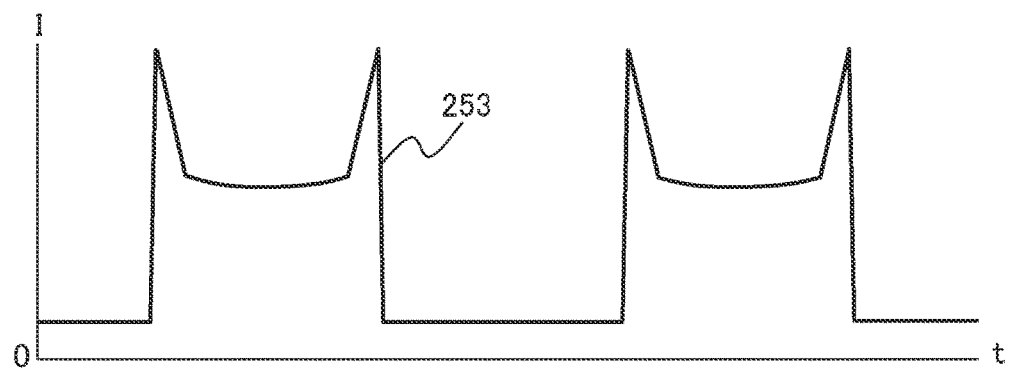
FIG. 17 is an explanatory diagram of a current that flows through a current limiting circuit 239 of the LED drive circuit 230.

FIG. 16 is a circuit diagram of an LED drive circuit 230 of a ninth embodiment. The same number is attached to the same member as that of the LED drive circuit 220 illustrated in FIG. 14 and explanation is omitted. FIG. 17 is an explanatory diagram of a current that flows through a current limiting circuit 239 of the LED drive circuit 230, illustrating two periods of a full-wave rectified waveform. In FIG. 17, the vertical axis I represents the current and the horizontal axis t represents the time.

The difference between the LED drive circuit 230 illustrated in FIG. 16 and the LED drive circuit 220 illustrated in FIG. 14 lies only in that the zener diode 204 (third zener diode) of the LED drive circuit 220 is replaced with a series circuit having a zener diode 204a (fourth zener diode) and a resistor 218 in the current limiting circuit 239 of the LED drive circuit 230.

As illustrated in FIG. 17, in a current waveform 253 of a current that flows through the current limiting circuit 239 included in the LED drive circuit 230, the bottom of the concavity is somewhat concave compared to that of the current waveform 252 illustrated in FIG. 15. In other words, in the LED drive circuit 230, bright fluctuations (power consumption) accompanying fluctuations in the voltage (effective value) of the commercial alternating-current power source are further reduced while preventing the concavity of the current waveform 253 from becoming too large (larger than the current waveform 252 illustrated in FIG. 15 and smaller than the current waveform 251 illustrated in FIG. 13) by the zener diode 204a and the resistor 218.

Tenth Embodiment

Figure 18:
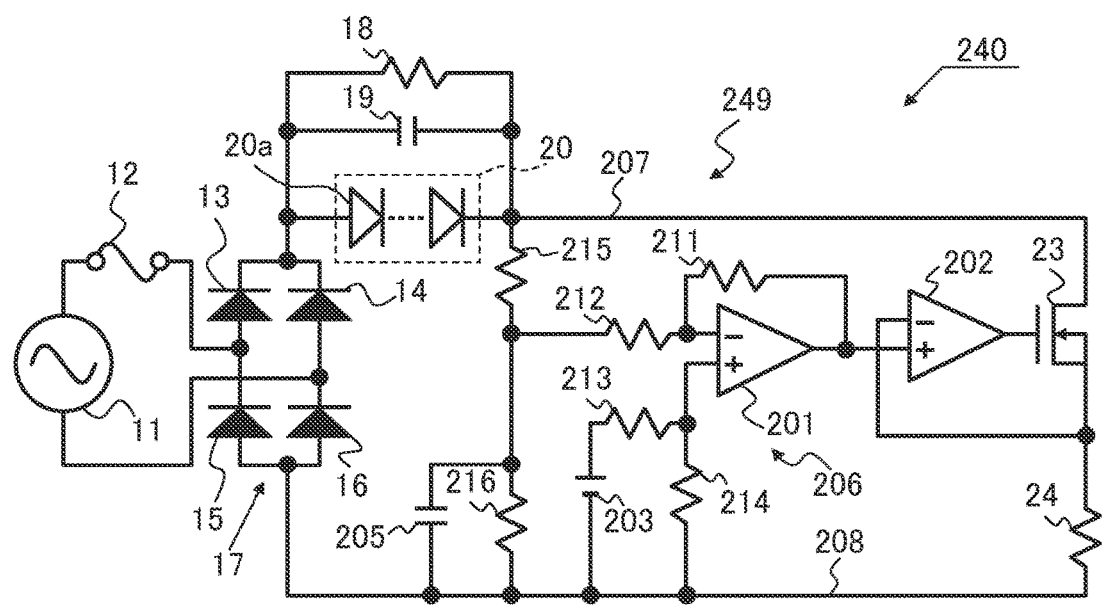
FIG. 18 is a circuit diagram of an LED drive circuit 240 of a tenth embodiment.
Figure 19:
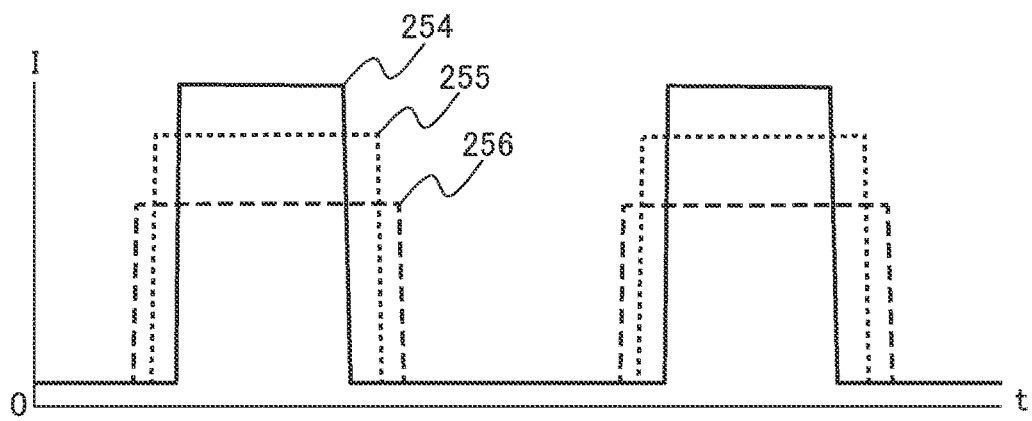
FIG. 19 is an explanatory diagram of currents that flow through a current limiting circuit 249 of the LED drive circuit 240.

FIG. 18 is a circuit diagram of an LED drive circuit 240 of a tenth embodiment. The same number is attached to the same member as that of the LED drive circuit 210 illustrated in FIG. 12 and explanation is omitted. FIG. 19 is an explanatory diagram of currents that flow through a current limiting circuit 249 of the LED drive circuit 240, illustrating two periods of each full-wave rectified waveform. In FIG. 19, the vertical axis I represents the current and the horizontal axis t represents the time.

The difference between the LED drive circuit 240 illustrated in FIG. 18 and the LED drive circuit 210 illustrated in FIG. 12 lies only in that a capacitor 205 is added in the current limiting circuit 249 of the LED drive circuit 240 compared to the LED drive circuit 210 (it can also be said that the zener diode 204 in FIG. 14 is replaced with the capacitor 205. At this time, the resistor 217 is ignored). The capacitor 205 is connected in parallel with the sixth resistor 216. As the capacitor 205, a capacitor whose capacitance is comparatively large (for example, 100 μF) is used so that the voltage at the left end of the resistor 212, which is the input terminal of the inverting amplifier circuit 206, is constant.

As illustrated in FIG. 19, current waveforms 254, 255, and 256 of currents that flow through the current limiting circuit 249 included in the LED drive circuit 240 have no concavity and the top portions are flat. In FIG. 19, the current waveforms 254, 255, and 256 corresponding to three effective values are drown and the effective value is larger in the order. In the LED drive circuit 240, when the effective value of the commercial alternating-current power source 11 is large, the width of the current waveform is great, but the height of the current waveform is reduced. Thus, brightness (power consumption) may be kept substantially constant for fluctuations in the effective value of the commercial alternating-current power source 11. In the LED drive circuit 240, no steeple value appears in the current waveform, and therefore there are characteristics that accidental element breakdown is unlikely to occur.

Eleventh Embodiment

Figure 20:
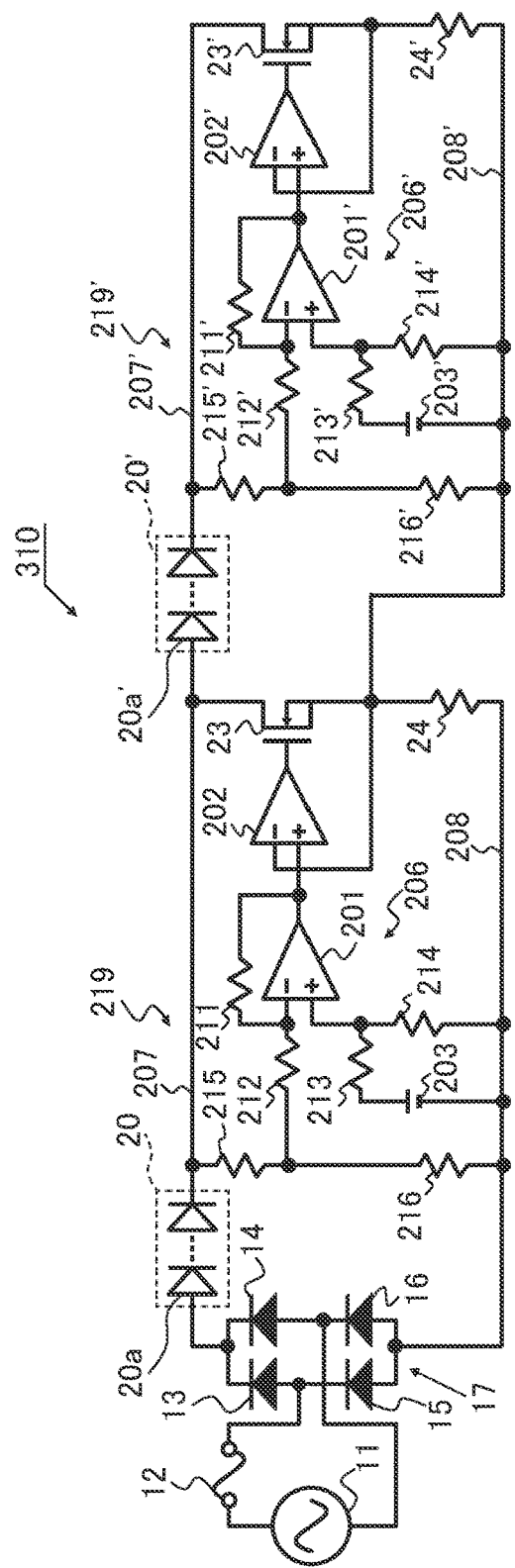
FIG. 20 is a circuit diagram of an LED drive circuit 310 of an eleventh embodiment.

FIG. 20 is a circuit diagram of an LED drive circuit 310 of an eleventh embodiment. As illustrated in FIG. 20, the LED drive circuit 310 includes the bridge rectifier circuit 17, the LED string 20 in which a plurality of LEDs 20a is connected in series, an LED string 20' (second LED string) in which a plurality of LEDs 20a' is connected in series, the current limiting circuit 219 having the current input terminal 207 and the current output terminal 208, and a current limiting circuit 219' (second current limiting circuit) having a current input terminal 207' (second current input terminal) and a current output terminal 208' (second current output terminal). The LED drive circuit 310 is a multistage LED drive circuit in which the LED strings and the current limiting circuits are linked in two stages.

The commercial alternating-current power source 11, the fuse 12, the bridge rectifier circuit 17, and the LED string 20 and the current limiting circuit 219 in the first stage are equivalent to those of the LED drive circuit 210 illustrated in FIG. 12. Further, the current limiting circuit 219' in the second stage is also equivalent to the current limiting circuit 219 of the LED drive circuit 210 and has an FET 23', a current detection resistor 24', an inverting amplifier circuit 206', a second operational amplifier 202', a fifth resistor 215', and a sixth resistor 216' and the inverting amplifier circuit 206' has a first operational amplifier 201', a reference voltage source 203', and resistors 211' to 214'. The LED string 20' in the second stage may be one equivalent to the LED string 20 or may be different form the LED string 20 in the kind of LED or in the number of stages, or both in the kind of LED and in the number of stages.

A terminal that outputs a current of the bridge rectifier circuit 17 is connected to the anode of the LED string 20, the cathode of the LED string 20 is connected to the current input terminal 207, and the current output terminal 208 is connected to a terminal to which the current of the bridge rectifier circuit 17 returns. Further, the cathode of the LED string 20 is also connected to the anode of the LED string 20' and the cathode of the LED string 20' is connected to the current input terminal 207'. The current output terminal 208' is connected to the source of the FET 23 of the current limiting circuit 219, the top end of the current detection resistor 24, and the inverting input terminal of the second operational amplifier 202. In other words, the LED string 20' is connected in series to the LED string 20 and the current input terminal 207' and the current output terminal 208' are connected between the LED string 20' and the current limiting circuit 219.

The current limiting circuit 219 limits a current that flows through the LED string 20 to a first upper limit current value or smaller and the current limiting circuit 219' limits a current that flows through the LED string 20' to a second upper limit current value or smaller. The current limiting circuit 219' decreases the second upper limit current value in accordance with an amount of rise in the voltage when the voltage at the current input terminal 207' viewed from the current output terminal 208' rises like the current limiting circuit 219. The first upper limit current value and the second upper limit current value may be the same value or may be different values.

Although not illustrated schematically, three or more stages of the LED string and the current limiting circuit may be linked in one LED drive circuit. Further, the current limiting circuits 219 and 219' in FIG. 20 may be replaced with any of the current limiting circuits 29, 59, 79, 89, 99, 229, 239, and 249 illustrated in FIG. 1, FIG. 5, FIG. 7, FIG. 8, FIG. 10, FIG. 14, FIG. 16, and FIG. 18. In this case, the current limiting circuit 219 in the first stage and the current limiting circuit 219' in the send stage may be the same circuit or may be different circuits.

Figure 21:
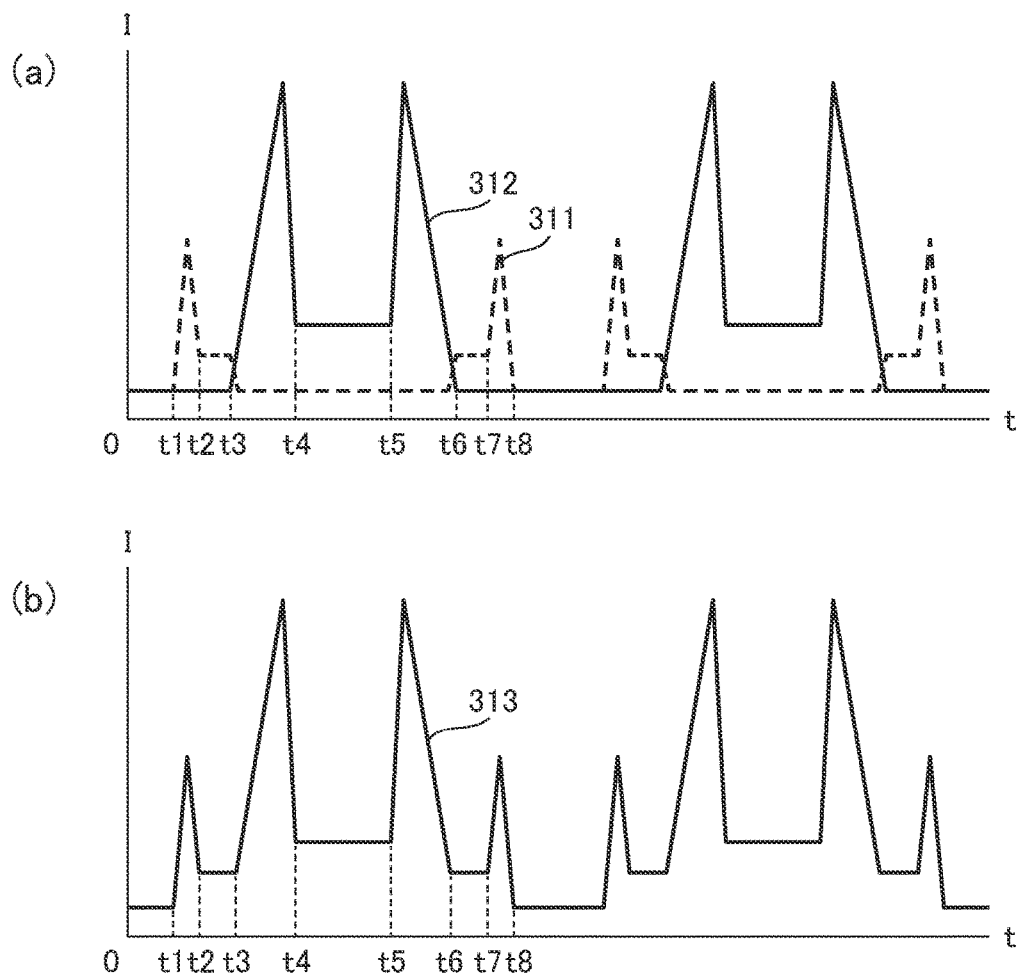
FIG. 21A and FIG. 21B are explanatory diagrams of currents that flow through the LED drive circuit 310 illustrated in FIG. 20.

FIG. 21A and FIG. 21B are explanatory diagrams of currents that flow through the LED drive circuit 310 illustrated in FIG. 20. In more detail, FIG. 21A illustrates current waveforms 311 and 312 at the current detection resistors 24 and 24' of the current limiting circuits 219 and 219' and FIG. 21B illustrates a combined waveform 313 thereof, corresponding to two periods of a full-wave rectified waveform. In FIG. 21A and FIG. 21B, the vertical axis I represents the current and the horizontal axis t represents the time and the horizontal axis tin FIG. 21A and that in FIG. 21B coincide with each other.

By using FIG. 21B, the operation of the LED drive circuit 310 is explained. In the phase in which the voltage of the full-wave rectified waveform rises, when the voltage thereof reaches the threshold voltage of the LED string 20, a current begins to flow sharply through the current detection resistor 24 (rise at time t1). When the voltage of the full-wave rectified waveform further rises, the output voltage of the inverting amplifier circuit 206 falls and the current that flows through the current detection resistor 24 decreases (fall at time t2). When the voltage of the full-wave rectified waveform further rises and the voltage thereof reaches the summation of the threshold voltage of the LED string 20, 20', a current begins to flow sharply through the current detection resistor 24' (rise at time t3). When the voltage of the full-wave rectified waveform further rises, the output voltage of the inverting amplifier circuit 206 falls and the current that flows through the current detection resistor 24' decreases (fall at time t4).

When the voltage of the full-wave rectified waveform passes the peak and begins to fall, the output voltage of the inverting amplifier circuit 206' rises and the current that flows through the current detection resistor 24' also increases (rise at time t5). In the phase in which the voltage of the full-wave rectified waveform falls, when the voltage thereof reaches the summation of the threshold voltage of the LED string 20, 20', the current that flows through the current detection resistor 24' decreases sharply (fall at time t6). When the voltage of the full-wave rectified waveform further falls, the output voltage of the inverting amplifier circuit 206 rises and the current that flows through the current detection resistor 24 also increases (rise at time t7). When the voltage of the full-wave rectified waveform further falls and the voltage thereof reaches the threshold voltage of the LED string 20, the current that flows through the current detection resistor 24 decreases sharply (fall at time t8).

In the LED drive circuit 310 also, as in the LED drive circuit 10 and the like, when the effective value of the full-wave rectified waveform increases, while the widths of the current waveforms 311 and 312 are great, the concavities of the current waveforms 311 and 312 are large. Thus, in the LED drive circuit 310, the amount of emitted light (power consumption) of the LED strings 20 and 20' is kept substantially constant for fluctuations in the effective value of the full-wave rectified waveform.

Twelfth Embodiment

Figure 22:
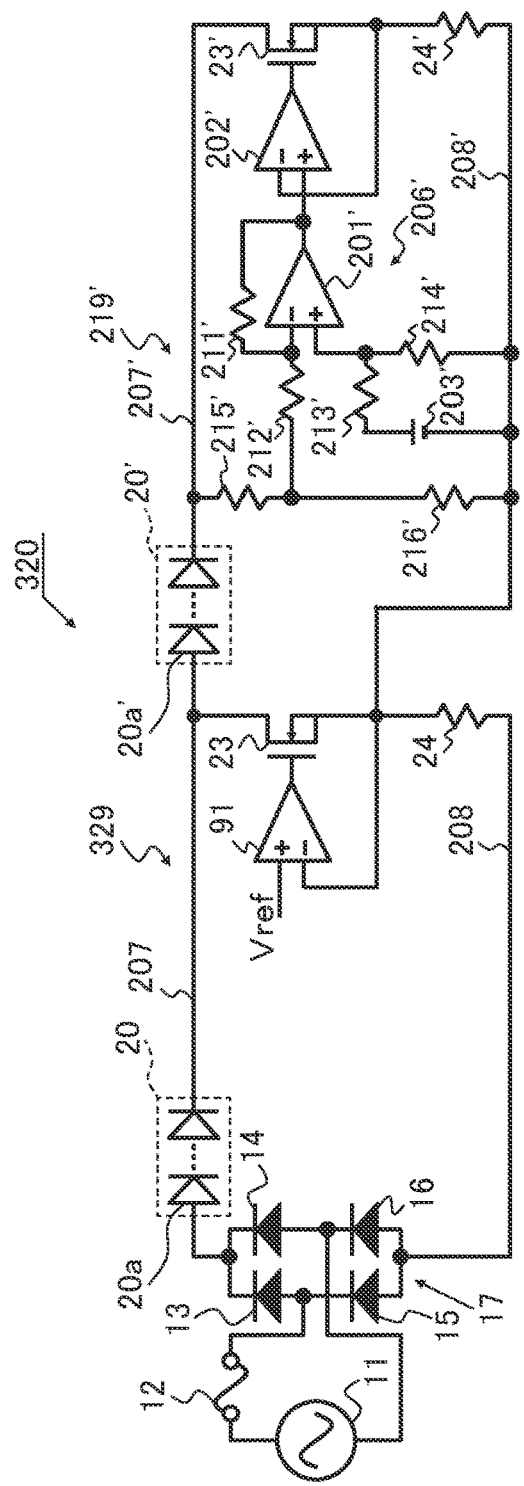
FIG. 22 is a circuit diagram of an LED drive circuit 320 of a twelfth embodiment.

FIG. 22 is a circuit diagram of an LED drive circuit 320 of a twelfth embodiment. The difference between the LED drive circuit 320 illustrated in FIG. 22 and the LED drive circuit 310 illustrated in FIG. 20 lies only in that the current limiting circuit 219 in the first stage in the LED drive circuit 310 is replaced with a current limiting circuit 329 in the LED drive circuit 320. The current limiting circuit 329 includes the FET 23, the current detection resistor 24, and the operational amplifier 91 and these are equivalent to those of the LED drive circuit 90 illustrated in FIG. 10.

In the LED drive circuit 320, the current limiting circuit 329 in the first stage has only a function to simply limit a current that flows through the LED string 20 to an upper limit current value or smaller. On the other hand, the current limiting circuit 219' in the second stage has a function to suppress fluctuations in the amount of emitted light (power consumption) of the LED string 20' for fluctuations in the effective value of the full-wave rectified waveform, in addition to a function to limit a current that flows through the LED string 20' to an upper limit current value or smaller. Part of the current limiting circuits in the multistage LED drive circuit may be a simple constant current circuit, like the current limiting circuit 329 of the LED drive circuit 320. In the LED drive circuit 320, the LED string 20, the current input terminal 207, the current output terminal 208, and the current limiting circuit 329 respectively correspond to the second LED string, the second current input terminal, the second current output terminal, and the second current limiting circuit.

Figure 23:
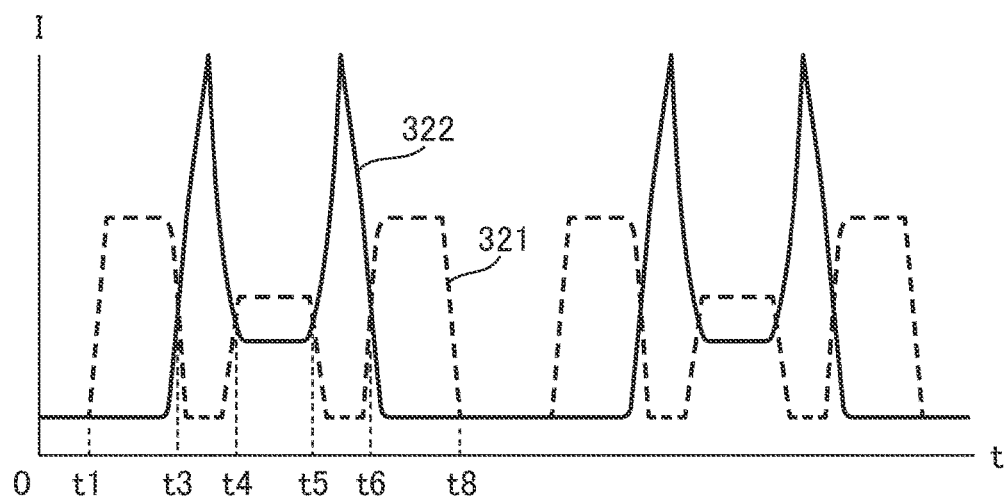
FIG. 23 is an explanatory diagram of currents that flow through the LED drive circuit 320 illustrated in FIG. 22.

FIG. 23 is an explanatory diagram of currents that flow through the LED drive circuit 320 illustrated in FIG. 22. FIG. 23 illustrates current waveforms 321 and 322 at the current detection resistors 24 and 24' of the current limiting circuits 329 and 219', corresponding to two periods of a full-wave rectified waveform. In FIG. 23, the vertical axis I represents the current and the horizontal axis t represents the time. In the LED drive circuit 320, in correspondence to that the function to suppress fluctuations in the amount of emitted light (power consumption) for fluctuations in the effective value of the full-wave rectified waveform does not exist in the current limiting circuit 329 in the first stage, the concavity of the waveform, which occurs between time t2 and time t3 and between time t6 and time t7 in FIG. 21B in the LED drive circuit 310, is not observed.

Thirteenth Embodiment

Figure 24:
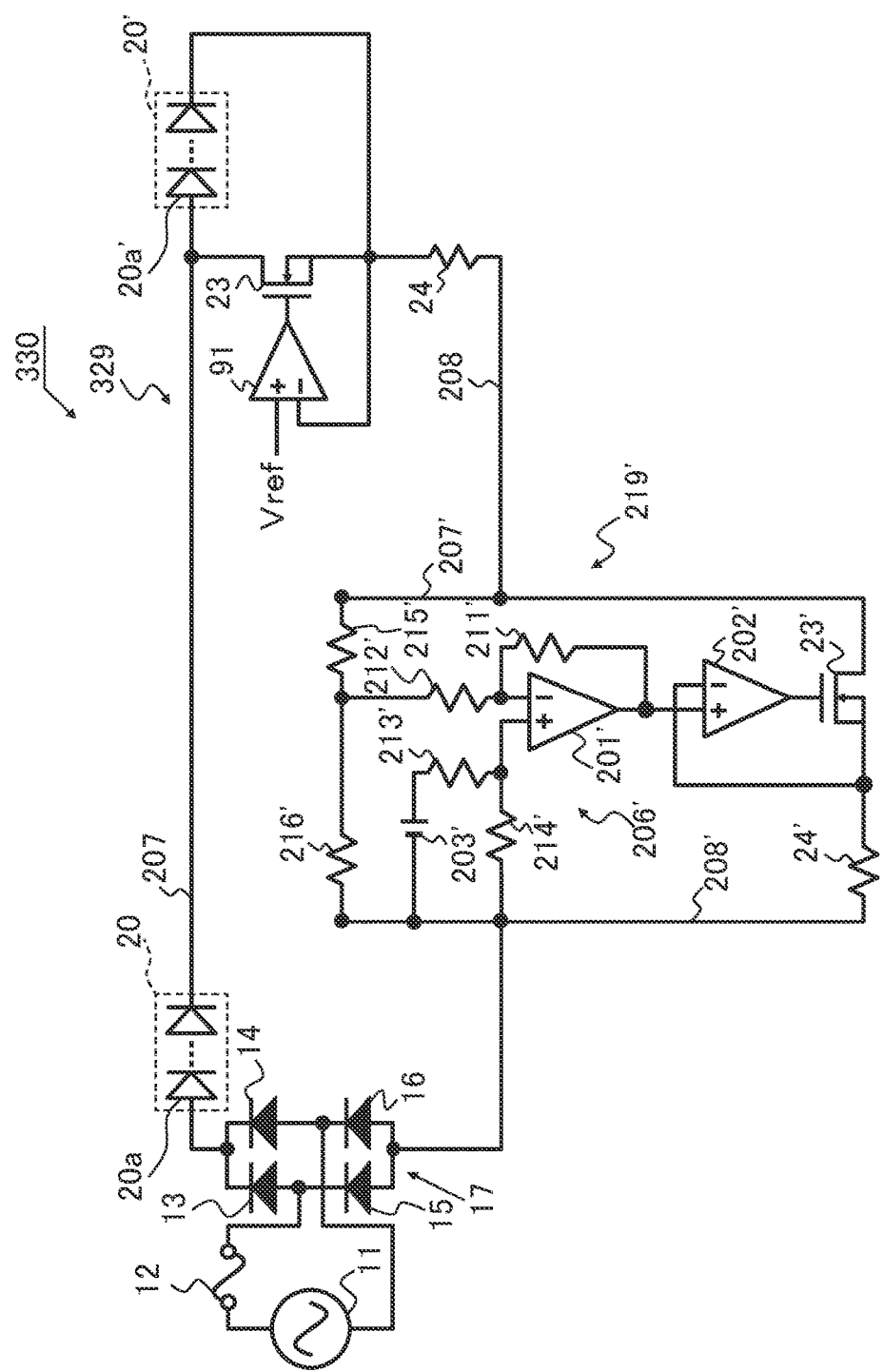
FIG. 24 is a circuit diagram of an LED drive circuit 330 of a thirteenth embodiment.

FIG. 24 is a circuit diagram of an LED drive circuit 330 of a thirteenth embodiment. The difference between the LED drive circuit 330 illustrated in FIG. 24 and the LED drive circuit 320 illustrated in FIG. 22 lies only in that the connection position of the current limiting circuit 219' in the second stage in the LED drive circuit 320 is changed to a position between the current output terminal 208 of the current limiting circuit 329 in the first stage and a terminal to which a current of the bridge rectifier circuit 17 returns. In the LED drive circuit 330 also, the LED string 20, the current input terminal 207, the current output terminal 208, and the current limiting circuit 329 respectively correspond to the second LED string, the second current input terminal, the second current output terminal, and the second current limiting circuit.

Figure 25:
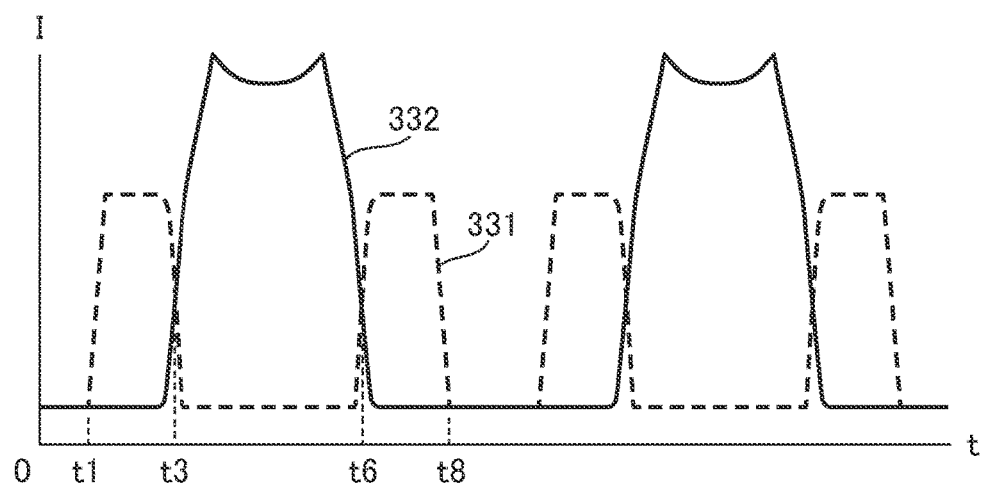
FIG. 25 is an explanatory diagram of currents that flow through the LED drive circuit 330 illustrated in FIG. 24.

FIG. 25 is an explanatory diagram of currents that flow through the LED drive circuit 330 illustrated in FIG. 24, illustrating current waveforms 331 and 332 at the current detection resistors 24 and 24' of the current limiting circuits 329 and 219', corresponding to two periods of a full-wave rectified waveform. In FIG. 25, the vertical axis I represents the current and the horizontal axis t represents the time. The current waveforms in the LED drive circuit 330 are similar to those in the LED drive circuit 320 illustrated in FIG. 23, but in the LED drive circuit 330, the concavity of the current waveform 332 is smaller than that of the current waveform 322 in the LED drive circuit 320 in FIG. 23, the shapes of the concavities (degrees of concavities) of the current waveforms 331 and 332 are different from those of the waveforms 321 and 322 in FIG. 23, since the values of the fifth resistor 215' and the sixth resistor 216' in FIG. 24 are different from those of the fifth resistor 215' and the sixth resistor 216' in FIG. 22.

Fourteenth Embodiment

Figure 26:
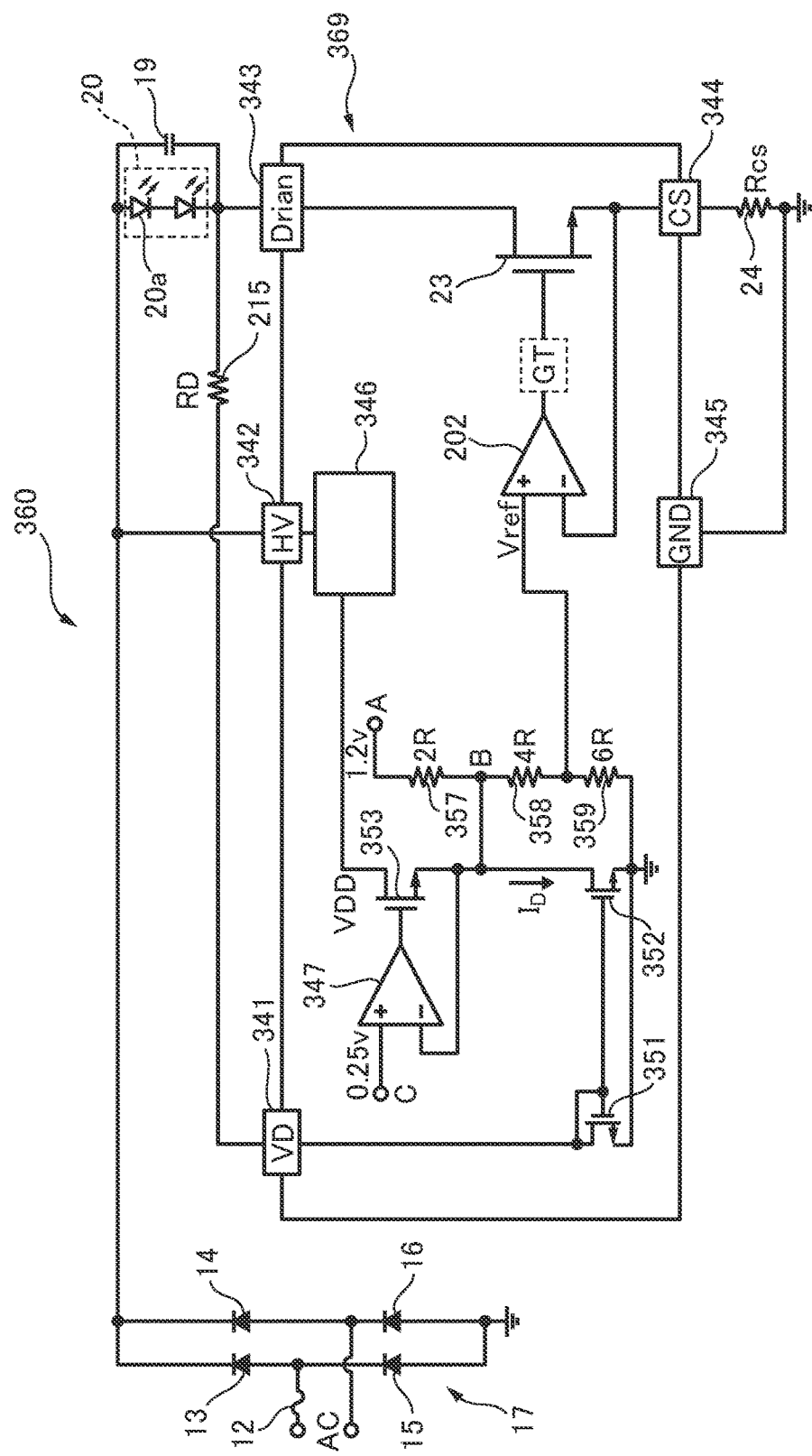
FIG. 26 is a circuit diagram of an LED drive circuit 360 of a fourteenth embodiment.

FIG. 26 is a circuit diagram of an LED drive circuit 360 of a fourteenth embodiment. As illustrated in FIG. 26, the LED drive circuit 360 includes the bridge rectifier circuit 17, the capacitor 19, the LED string 20, and a current limiting circuit 369. In FIG. 26, schematic representation of the commercial alternating-current power source 11 is omitted. Although not illustrated schematically, the LED drive circuit 360 may include the same resistor as the resistor 18 of the LED drive circuit 100 in FIG. 11.

The current limiting circuit 369 is an IC circuit formed in an IC having a VD terminal 341, an HV terminal 342, a drain terminal 343, a source terminal 344, and a GND terminal 345 and is an example in which the same functions as those of the current limiting circuit 29 in FIG. 1 and the like are implemented by using a mirror current. The drain terminal 343 and the GND terminal 345 function as the current input terminal and the current output terminal, respectively, of the current limiting circuit 369. A terminal that outputs a current of the bridge rectifier circuit 17 is connected to the anode of the LED string 20 and the cathode of the LED string 20 is connected to the drain terminal 343. The capacitor 19 is connected in parallel to the LED string 20. Further, a terminal to which the current of the bridge rectifier circuit 17 returns and the GND terminal 345 are grounded.

The current limiting circuit 369 includes the FET 23 (switch element), the current detection resistor 24, a first operational amplifier 347, the second operational amplifier 202, the fifth resistor 215, a seventh resistor 357, an eighth resistor 358, a ninth resistor 359, a first FET 351, a second FET 352, and a third FET 353.

The drain (one end) of the FET 23 is connected to the drain terminal 343 (current input terminal), the source (the other end) thereof is connected to the top end (one end) of the current detection resistor 24 via the source terminal 344, and the FET 23 further has a gate (control terminal). The bottom end (the other end) of the current detection resistor 24 is grounded along with the GND terminal 345 (current output terminal). The non-inverting input terminal of the second operational amplifier 202 is connected between the eighth resistor 358 and the ninth resistor 359, the inverting input terminal thereof is connected to the top end (one end) of the current detection resistor 24 via the source terminal 344, and the output terminal thereof is connected to the gate of the FET 23. The left end (one end) of the fifth resistor 215 is connected to the drain of the first FET 351 via the VD terminal 341 and the right end (the other end) thereof is connected to a path from the terminal that outputs the current of the bridge rectifier circuit 17 up to the drain terminal 343 (current input terminal) via the LED string 20.

The gates of the first FET 351 and the second FET 352 are connected to each other. The sources of the first FET 351 and the second FET 352 are grounded. The drain of the second FET 352, the inverting input terminal of the first operational amplifier 347, the source of the third FET 353, the seventh resistor 357, and the eighth resistor 358 are connected to one another. The drain of the third FET 353 is connected to a drive power source 346 that is connected to the HV terminal 342 and from here, a power source voltage VDD is input to the third FET 353. The gate of the third FET 353 is connected to the output terminal of the first operational amplifier 347. The seventh resistor 357, the eighth resistor 358, and the ninth resistor 359 are connected in series in the order and the bottom end (one end) of the ninth resistor 359 is grounded.

A first reference voltage is input to the top end (one end) of the seventh resistor 357 from a terminal A. The voltage at a terminal B between the seventh resistor 357 and the eighth resistor 358 is a voltage lower than the first reference voltage. A second reference voltage lower than the voltage at the terminal B is input to the non-inverting input terminal of the first operational amplifier 347 from a terminal C. In the example illustrated schematically, the ratio of the resistance values of the seventh resistor 357, the eighth resistor 358, and the ninth resistor 359 is 2:4:6 and when the first reference voltage is taken to be 1.2 V, when no current is flowing through the second FET 352 and the third FET 353, the voltage at the terminal B and the second reference voltage are 1.0 V and 0.25 V, respectively.

The current limiting circuit 369 adjusts Vref, which is the input voltage to the non-inverting input terminal of the second operational amplifier 202. When the voltage of the full-wave rectified waveform does not reach the threshold voltage of the LED string 20 and no current is flowing through the resistor 215, no current flows through the second FET 352 and the third FET 353, and therefore the voltage value of Vref is 0.6 V by the voltage dividing effect of the seventh resistor 357, the eighth resistor 358, and the ninth resistor 359. On the other hand, when the voltage of the full-wave rectified waveform exceeds the threshold voltage of the LED string 20 and a current is flowing through the fifth resistor 215, a mirror current ID whose magnitude is the same as that of the current flows from the drive power source 346, and therefore Vref falls. When the voltage at the terminal B is higher than 0.25 V, no current flows through the third FET 353. However, when the voltage at the terminal B is about to fall below 0.25 V, a current flows through the third FET 353 and a lower limit is set to Vref by 0.25 V of the second reference voltage. In other words, at this time, the voltage at the terminal B is fixed to 0.25 V and the minimum value of Vref is 0.15 V by the voltage dividing effect. Thus, in the current limiting circuit 369, the value of Vref changes between the maximum value 0.6 V and the minimum value 0.15 V.

The current limiting circuit 369 has a function to suppress fluctuations in the amount of emitted light (power consumption) for fluctuations in the effective value of the full-wave rectified waveform like the current limiting circuit 29 in FIG. 1 and the like by adjusting Vref, which is the input voltage to the non-inverting input terminal of the second operational amplifier 202, as described above. The current waveform of the current limiting circuit 369 of the LED drive circuit 360 is the same as that illustrated in FIG. 15.

Fifteenth Embodiment

Figure 27:
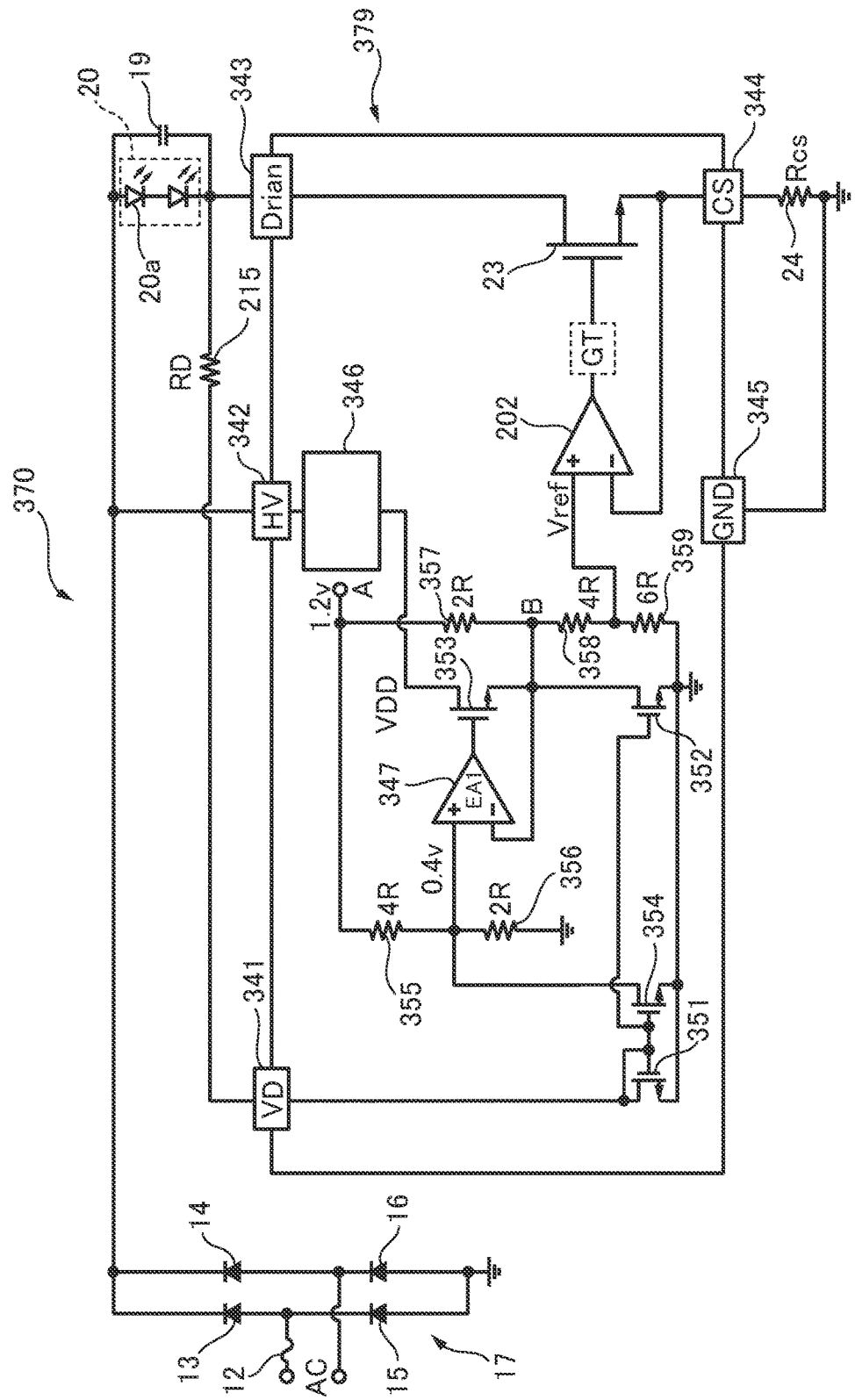
FIG. 27 is a circuit diagram of an LED drive circuit 370 of a fifteenth embodiment.
Figure 28:
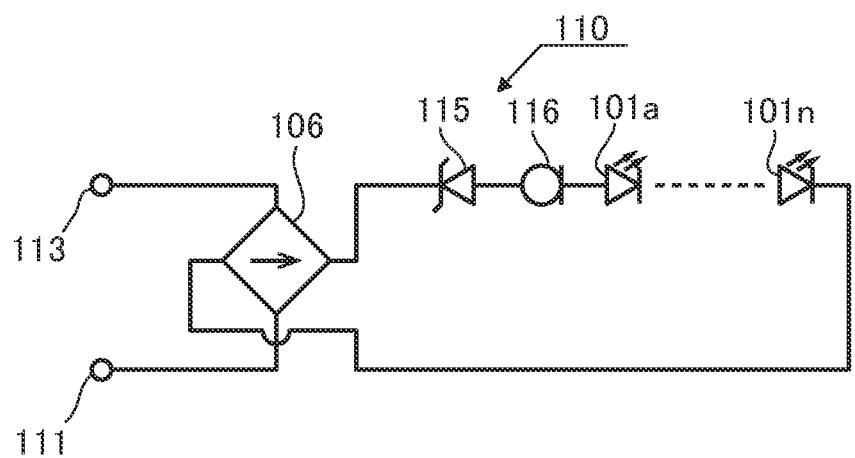
FIG. 28 is a circuit diagram of the LED drive circuit 110 in a conventional example.

FIG. 27 is a circuit diagram of an LED drive circuit 370 of a fifteenth embodiment. The different between the LED drive circuit 370 illustrated in FIG. 27 and the LED drive circuit 360 illustrated in FIG. 26 lies only in that a fourth FET 354, a resistor 355, and a resistor 356 are added in a current limiting circuit 379 of the LED drive circuit 370.

The drain of the fourth FET 354 is connected to the non-inverting input terminal of the first operational amplifier 347, the gate of the fourth FET 354 is connected to the gates of the first FET 351 and the second FET 352, and the source of the fourth FET 354 is grounded. The top end of the resistor 355 is connected to the terminal A to which the first reference voltage is input. The resistor 355 and the resistor 356 are connected in series, the point between the resistor 355 and the resistor 356 is connected to the non-inverting input terminal of the first operational amplifier 347, and the bottom end (one end) of the resistor 356 is grounded. In the example illustrated schematically, the ratio of the resistance values of the resistor 355, the resistor 356, the seventh resistor 357, the eighth resistor 358, and the ninth resistor 359 is 4:2:2:4:6. Further, the first reference voltage is 1.2 V, which is the same as the value in the current limiting circuit 369, but the input voltage to the non-inverting input terminal of the first operational amplifier 347, which corresponds to the second reference voltage, is 0.4 V in the current limiting circuit 379 when no current is flowing through the fourth FET 354.

Like the current limiting circuit 369 of the LED drive circuit 360, the current limiting circuit 379 adjusts Vref, which is the input voltage to the non-inverting input terminal of the second operational amplifier 202. Further, in the current limiting circuit 369, a lower limit is set to Vref by 0.25 V of the second reference voltage, but in the current limiting circuit 379, the input voltage to the non-inverting input terminal of the first operational amplifier 347 changes in accordance with the resistance values of the resistors 355 and 356, and therefore the lower limit itself of Vref may be adjusted. Thus, in the current limiting circuit 379, the minimum value of Vref may be further set lower than 0.15 V, and therefore the current waveform of the current limiting circuit 379 of the LED drive circuit 370 is the same as that illustrated in FIG. 17. In other words, in the LED drive circuit 370, while the concavity of the current waveform is made larger than the current waveform 252 in FIG. 15 and smaller than the current waveform 251 in FIG. 13, bright fluctuations (power consumption) accompanying fluctuations in the voltage (effective value) of the commercial alternating-current power sources are further reduced.

What is claimed is:

1. An LED drive circuit comprising:
a bridge rectifier circuit;
an LED string made up by a plurality of LEDs being connected in series and supplied with a current from the bridge rectifier circuit; and
a current limiting circuit that has a current input terminal and a current output terminal connected onto a path that starts from the bridge rectifier circuit, and returns to the bridge rectifier circuit via the LED string, and a switch element having one end as the current input terminal and another end as the current output terminal, and having a control terminal, which limits a current that flows through the LED string to an upper limit current value or smaller, and further, decreases the current that flows through the LED string in accordance with an amount of rise in the voltage when the voltage at the current input terminal viewed from the current output terminal rises, by controlling a voltage applied to the control terminal of the switch element, and the upper limit current value is a current value flowing through the LED string when a threshold voltage, at which all of the LEDs of the plurality of LEDs included in the LED string turn on, is applied to the LED string.

2. The LED drive circuit according to claim 1, wherein the current limiting circuit further comprises a current detection resistor, a current detection element, a first resistor, and a second resistor,
the other end of the switch element is connected to the current output terminal via the current detection resistor,
the other end of the current detection resistor is connected to the current output terminal,
the current detection element has an inverting input terminal connected to one end of the first resistor and one end of the second resistor and an output terminal connected to the control terminal,
the other end of the first resistor is connected to the one end of the switch element, and
the other end of the second resistor is connected to the other end of the switch element and the one end of the current detection resistor.

3. The LED drive circuit according to claim 2, wherein the current detection element includes a transistor, an operational amplifier, or a shunt regulator.

4. The LED drive circuit according to claim 2, wherein the current detection element includes a transistor and a first zener diode.

5. The LED drive circuit according to claim 2, wherein the current limiting circuit further comprises a second zener diode between the one end of the current detection resistor and the one end of the first resistor.

6. The LED drive circuit according to claim 5, wherein the current limiting circuit further comprises a third resistor inserted between the second zener diode and the one end of the first resistor and a fourth resistor inserted between the one end of the first resistor and the one end of the second resistor.

7. The LED drive circuit according to claim 1, further comprising a capacitor and a resistor connected in parallel to the LED string.

8. The LED drive circuit according to claim 1, wherein the current limiting circuit further comprises a current detection resistor, an inverting amplifier circuit including a first operational amplifier, a second operational amplifier, a fifth resistor, and a sixth resistor,
the other end of the switch element is connected to the current output terminal via the current detection resistor,
the other end of the current detection resistor is connected to the current output terminal,
an input terminal of the inverting amplifier circuit is connected to one end of the fifth resistor or one end of the sixth resistor and an output terminal is connected to a non-inverting input terminal of the second operational amplifier,
an inverting input terminal of the second operational amplifier is connected to one end of the current detection resistor and an output terminal is connected to the control terminal,
the other end of the fifth resistor is connected to a path from a terminal that outputs a current of the bridge rectifier circuit up to the current input terminal via the LED string,
the other end of the sixth resistor is connected to the one end of the current detection resistor, and
the fifth resistor and the sixth resistor are connected in series.

9. The LED drive circuit according to claim 8, wherein the current limiting circuit further comprises a third zener diode whose anode is connected to the other end of the sixth resistor and whose cathode is connected to one end of the fifth resistor or one end of the sixth resistor.

10. The LED drive circuit according to claim 8, wherein the current limiting circuit further comprises a series circuit of a fourth zener diode whose anode is connected to the other end of the sixth resistor and a resistor connected to one end of the fifth resistor or one end of the sixth resistor.

11. The LED drive circuit according to claim 8, wherein the current limiting circuit further comprises a capacitor inserted between the other end of the sixth resistor and one end of the fifth resistor or between the other end of the sixth resistor and one end of the sixth resistor.

12. The LED drive circuit according to claim 1, further comprising:
a second LED string made up by a plurality of LEDs being connected in series and connected in series to the LED string; and
a second current limiting circuit that limits a current that flows through the second LED string to a second upper limit current value or smaller.

13. The LED drive circuit according to claim 12, wherein the second current limiting circuit has a second current input terminal and a second current output terminal connected between the second LED string and the current limiting circuit and decreases the second upper limit current value in accordance with an amount of rise in the voltage when the voltage at the second current input terminal viewed from the second current output terminal rises.

14. The LED drive circuit according to claim 1, wherein the current limiting circuit further comprises a current detection resistor, a first operational amplifier, a second operational amplifier, a fifth resistor, a seventh resistor, an eighth resistor, a ninth resistor, a first FET, a second FET, and a third FET, the other end of the switch element is connected to the current output terminal via the current detection resistor the other end of the current detection resistor is connected to the current output terminal, a non-inverting input terminal of the second operational amplifier is connected between the eighth resistor and the ninth resistor, an inverting input terminal is connected to one end of the current detection resistor, and an output terminal is connected to the control terminal, one end of the fifth resistor is connected to the drain of the first FET and the other end is connected to a path from a terminal that outputs a current of the bridge rectifier circuit up to the current input terminal via the LED string, the gates of the first FET and the second FET are connected to each other, the sources of the first FET and the second FET are grounded, the drain of the second FET, an inverting input terminal of the first operational amplifier, the source of the third FET, the seventh resistor, and the eighth resistor are connected to one another, the drain of the third FET is connected to a driver power source and the gate of the third FET is connected to an output terminal of the first operational amplifier, the seventh resistor, the eighth resistor, and the ninth resistor are connected in series in this order, one end of the ninth resistor is grounded, a first reference voltage is input to one end of the seventh resistor, and a second reference voltage lower than or equal to a voltage between the seventh resistor and the eighth resistor is input to a non-inverting input terminal of the first operational amplifier.

\* \* \* \* \*